United States Patent [19]
Sugimoto et al.

[11] Patent Number: 5,656,088
[45] Date of Patent: Aug. 12, 1997

[54] APPARATUS FOR DIPPING SUBSTRATES IN PROCESSING FLUID

[75] Inventors: Kenji Sugimoto; Tadashi Maegawa; Akihiko Hidaka; Toshio Hiroe; Hideki Hayashi, all of Shiga-ken, Japan

[73] Assignee: Dainippon Screen Mfg. Co., Ltd., Japan

[21] Appl. No.: 936,030

[22] Filed: Aug. 26, 1992

[30] Foreign Application Priority Data

Aug. 28, 1991 [JP] Japan .................. 3-076957 U
Aug. 30, 1991 [JP] Japan .................. 3-246775
Jan. 14, 1992 [JP] Japan .................. 4-05097 U
Jun. 5, 1992 [JP] Japan .................. 4-045278 U

[51] Int. Cl.[6] ........................................ B05C 3/00
[52] U.S. Cl. ............................ 118/423; 118/428
[58] Field of Search ...................... 118/500, 428, 118/423, 429; 134/902; 414/935, 941, 416, 938; 156/345, 640

[56] References Cited

U.S. PATENT DOCUMENTS 4,715,637 12/1987 Hosada et al. ............... 414/914

FOREIGN PATENT DOCUMENTS

| 0034774 | 3/1979 | Japan | 118/500 |
|---|---|---|---|
| 362154750 | 7/1987 | Japan | 414/936 |
| 64-68933 | 3/1989 | Japan . | |
| 0316934 | 12/1989 | Japan | 414/902 |
| 2-34823 | 9/1990 | Japan . | |
| 403143837 | 6/1991 | Japan | 414/914 |
| 403266431 | 11/1991 | Japan | 414/902 |
| 404015920 | 1/1992 | Japan | 134/902 |
| 404199620 | 7/1992 | Japan | 414/902 |
| 4-58179 | 9/1992 | Japan . | |

*Primary Examiner*—Brenda A. Lamb
*Attorney, Agent, or Firm*—Ostrolenk, Faber, Gerb & Soffen, LLP

[57] ABSTRACT

For processing semiconductor substrates in a processing fluid, the substrates are introduced into a processing bath in which the processing fluid is filled. For holding the substrates in the process of introducing them into the processing bath, a holder having a pair of holding rods end a pair of aiding rods is prepared. A periodical linear array of grooves is formed on each rod. The rims of substrates are inserted into respective corresponding grooves on the rods so that the substrates do not touch respective side walls of the grooves in the aiding rod.

21 Claims, 19 Drawing Sheets

FIG. 9
FIG. 11
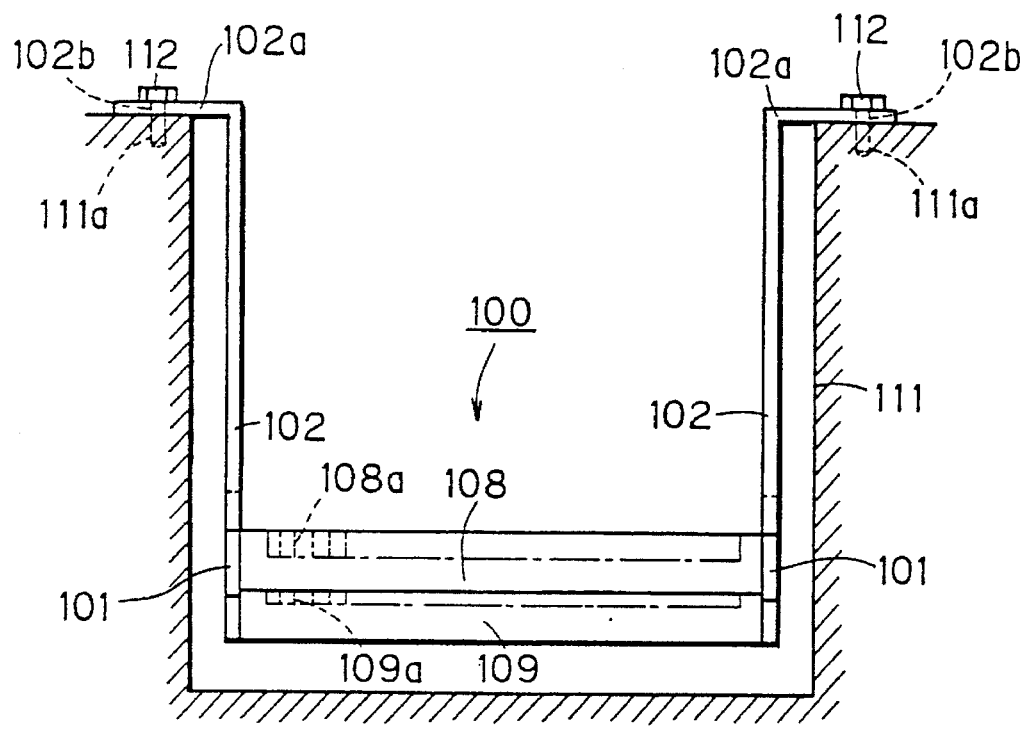
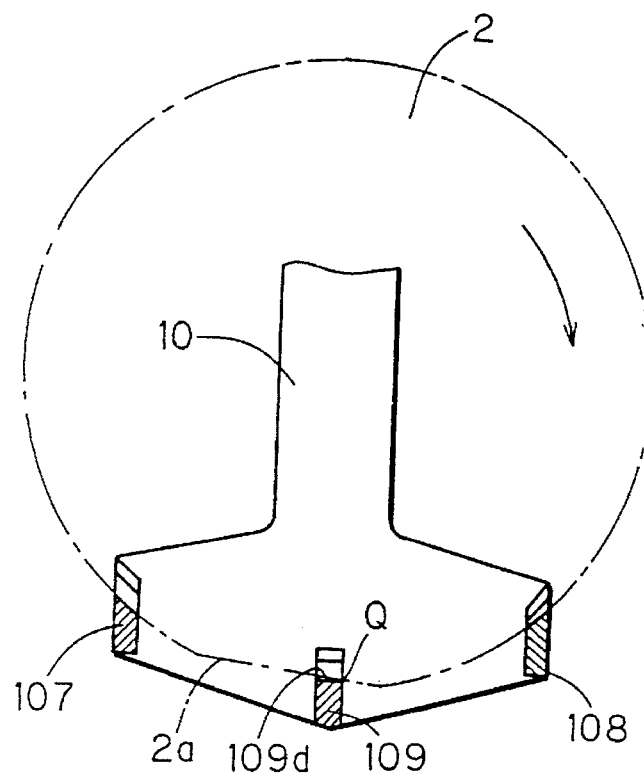

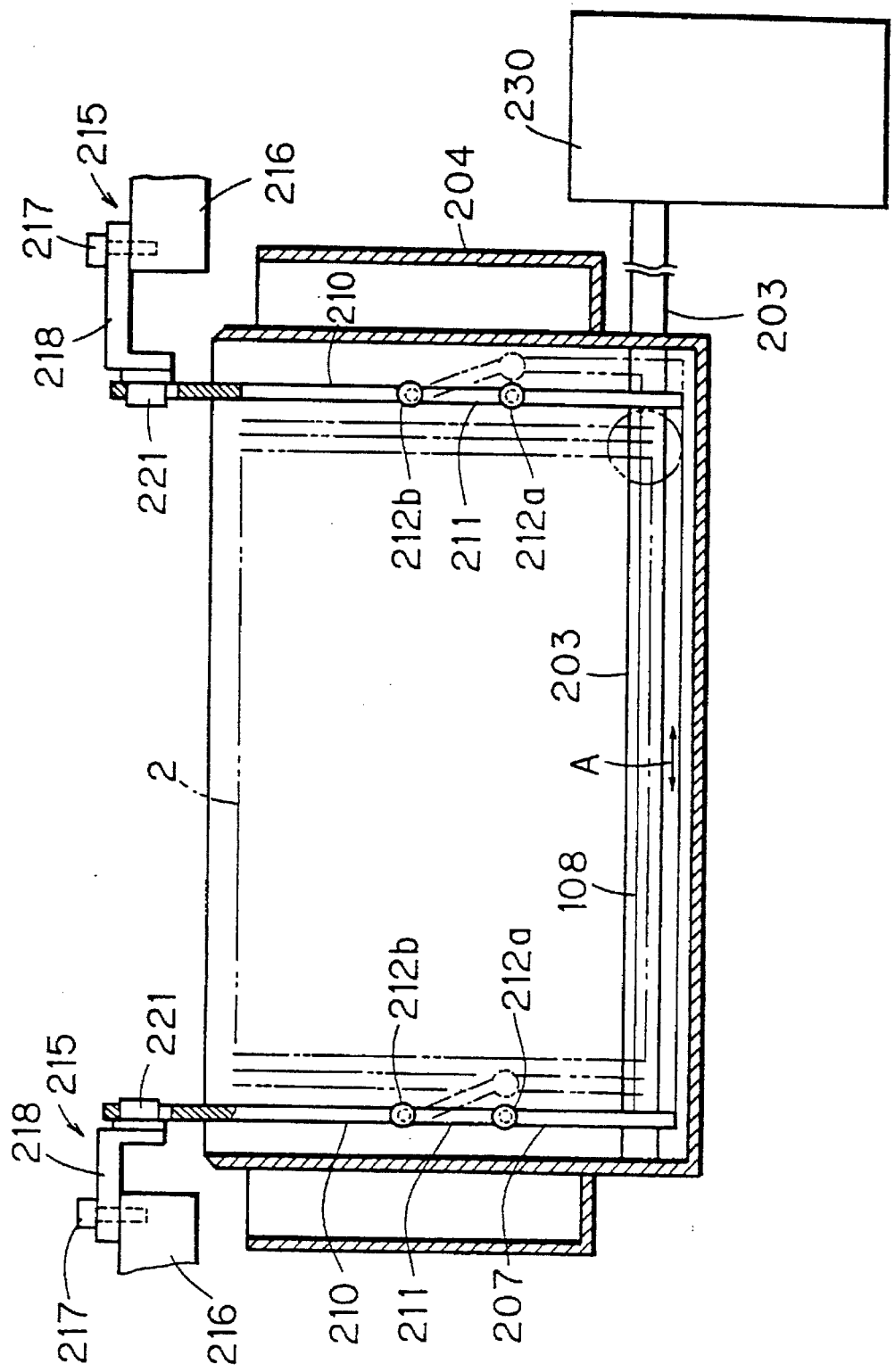

FIG. 17
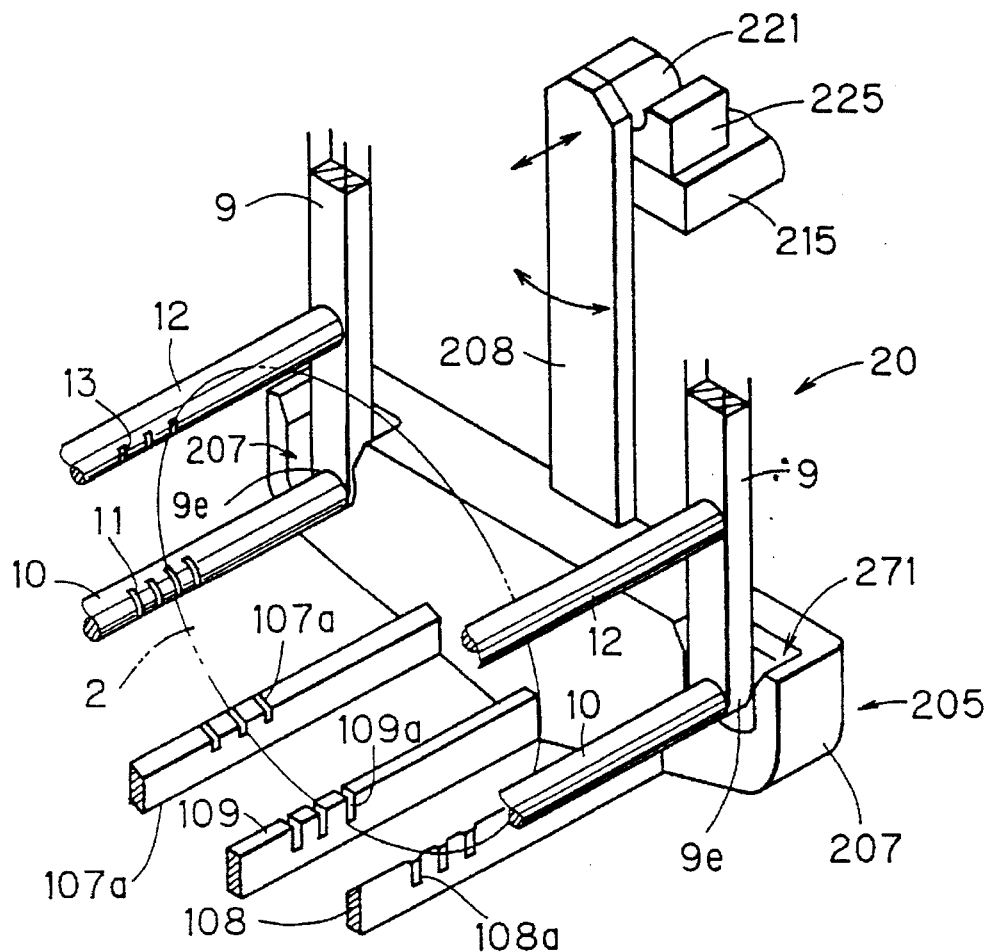
FIG. 18A
FIG. 18B
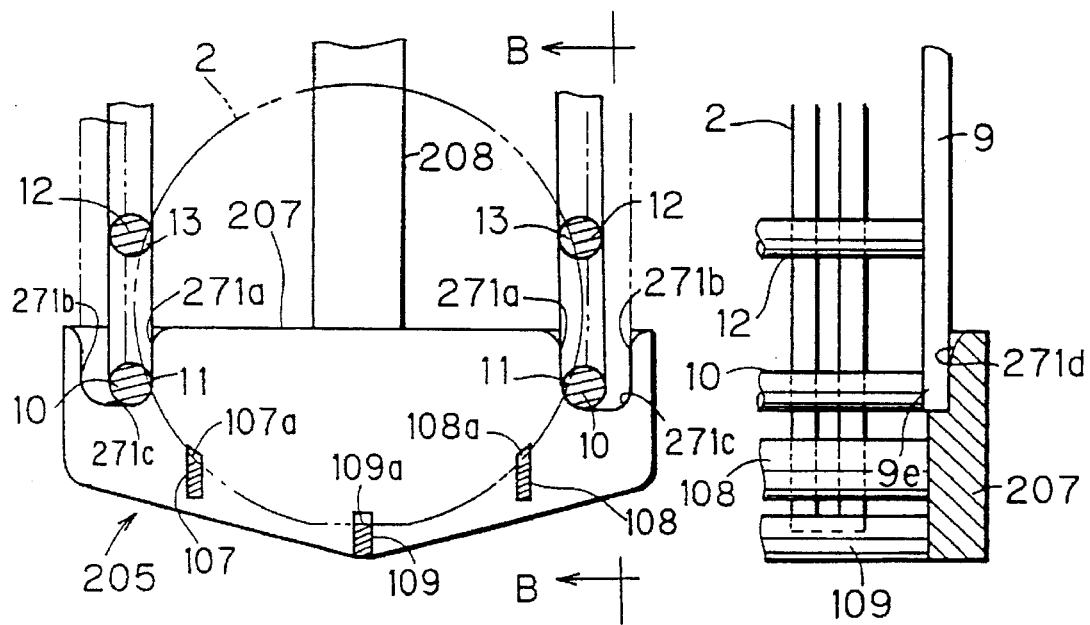

FIG.26C
PRIOR ART
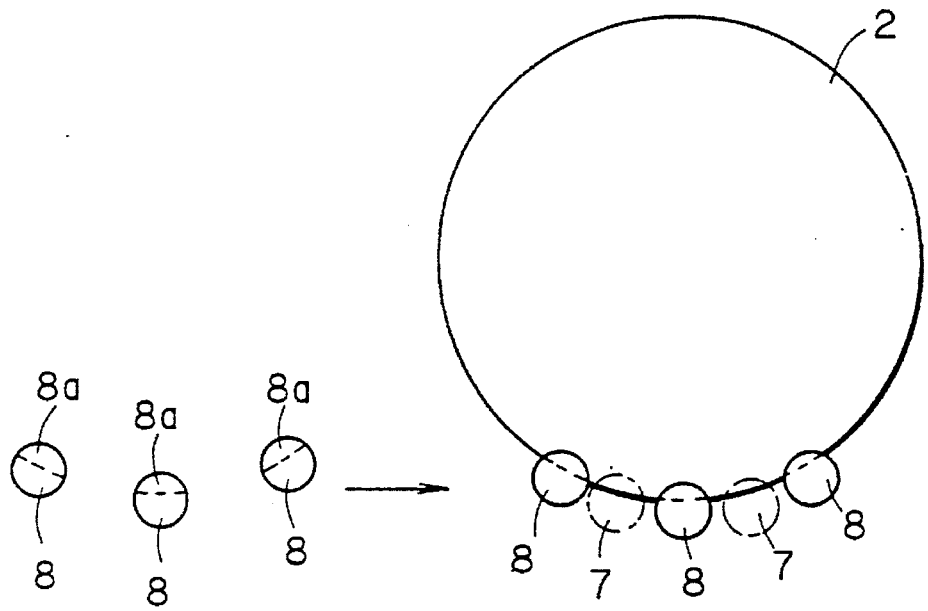
FIG.26B
PRIOR ART
FIG.26A
PRIOR ART
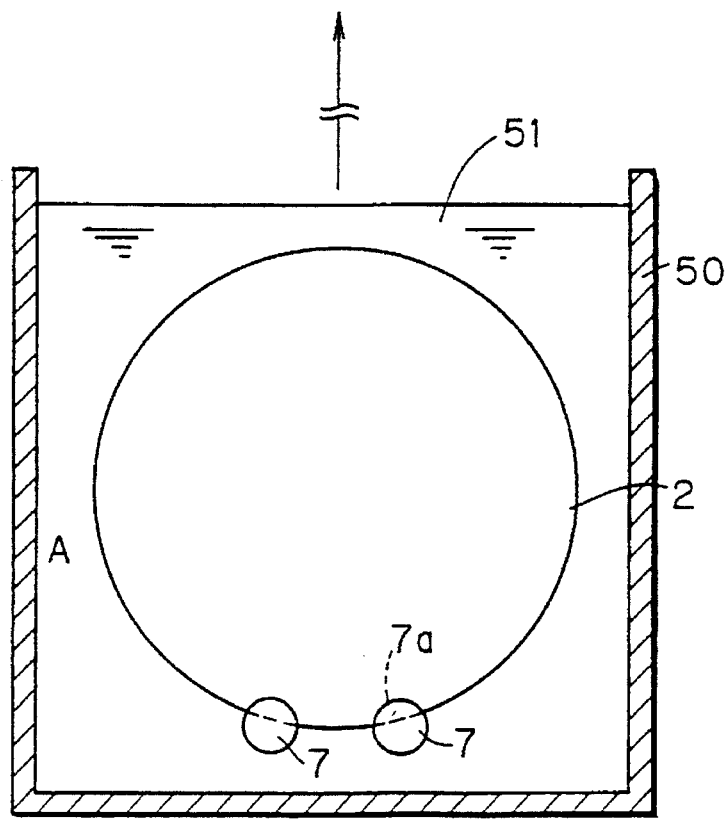

APPARATUS FOR DIPPING SUBSTRATES IN PROCESSING FLUID

BACKGROUND OF THE INVENTION

1. Field of the Invention

The present invention relates to a dip-type substrate processing apparatus for chemically processing thin plate substrates (hereinafter referred to simply as "substrates") such as semiconductor substrates, and glass substrates for liquid crystal or photomask applications. The present invention also relates to a method of holding substrates in the dip-type substrate processing apparatus.

2. Description of the Background Art

In recent years, much progress has been made in development of carrier-less dip-type substrate processing apparatuses. In such apparatuses for chemically processing substrates, substrates directly held by a chuck of a substrate holding device are immersed in a plurality of successive processing baths, without the assistance of a carrier for carrying the substrates.

A carrier-less dip-type substrate processing apparatus, as the name connotates, does not include a carrier. This creates various outstanding advantages over a conventional substrate processing apparatus which employs a carrier, in terms of maintenance costs and processing ability. For instance, the carrier-less apparatus reduces the sizes of processing baths since no carrier is used, and hence, less processing fluid and less pure water are necessary. Due to these advantages of decreased maintenance costs and improved processing ability, carrier-less dip-type substrate processing apparatuses are enjoying wider use in the industry.

FIGS. 24 to 26 show conventional substrate holding devices used in this type of substrate processing apparatuses.

The conventional substrate holding device of FIG. 24 comprises a pair of chucks 1. The chucks 1 bend inward at their lower portions. Two pairs of holding poles 3 are attached to the inward bents 1a of the chucks 1 so that two holding poles 3 face the other two holding poles 3. The holding poles 3 are notched at equal pitches on their inward surfaces. Guide grooves 3a formed on the holding poles 3 are in longitudinal alignment with each other, and therefore, capable of holding substrates 2.

A processing bath 50 is filled with a processing fluid 51 and equipped with a support member 4. Supported by the support member 4, the substrates 2 stand on end in the processing bath 50.

Guide grooves 4a are formed on the top surface of the support member 4. Since the pitches of the guide grooves 4a are the same as those of the guide grooves 3a, the substrates 2 slid into the grooves 4a will be supported on end and nearly parallel to each other.

The holding action of the substrates 2 by the chucks 1 involves opening the chucks 1 sideways to such an extent that the lower pair of the holding poles 3 do not touch the rims of the substrates 2 and thereafter lowering the chucks 1 to a predetermined point. The chucks 1 are then closed to slide the lower rims of the substrates 2 into the guide grooves 3a of the holding poles 3, and are lifted up with the substrates 2 fit in the grooves 3a at the rims.

The conventional substrate holding device of FIG. 25 comprises chucks 5 which are provided with holding plates 6 in their substrate holding portions. Guide grooves 6a are formed on the inward walls of the holding plates 6 at equal pitches. Substrates 2 are held at their rims by the holding plates 6.

FIGS. 26A–26C show another substrate holding device of conventional style. A support member for supporting the substrates is formed by two holding poles 7, each having guide grooves 7a formed on their inward surfaces. The holding poles 7 are disposed parallel to each other. A vertical driving means (not shown) travels the length of holding poles 7 in a vertical direction. The apparatus further comprises three other holding poles 8 which have guide grooves 8a (FIG. 26C) notched on their inward surfaces. The holding poles 8 are disposed parallel to each other. A horizontal driving means (not shown) moves along the length of the holding poles 8 in a horizontal direction.

The two holding poles 7 are moved away from the position shown in FIG. 26A to the position shown in FIG. 26B. The three holding poles 8 are then driven to slide below substrates 2. By moving the holding poles 7 downward, transfer of the substrates 2 from the holding poles 7 to the holding poles 8 is possible.

It is understood that FIGS. 24 to 26 omit illustration of driving means for driving the chucks for clarity.

Although being capable of holding substrates, the conventional substrate holding devices discussed above create the following problems.

A problem encountered in the device of FIG. 24 is that the processing bath 50 must have a sufficient width to allow the chucks 1 to be opened wide enough to receive the substrates 2.

This directly counters the original intention of the carrier-less approach, i.e. to cut maintenance costs by reducing the sizes of processing baths and hence the amount of processing fluids. Thus, the device of FIG. 24 largely defeats the merits of the carrier-less approach.

On the other hand, the device of FIG. 25 is superior to the device of FIG. 24 in that the processing bath 50 can be narrower since the chucks 5 need not open so wide to engage and hold the substrates 2.

However, the guide grooves 6a cut in the holding plates 6 have a large overall area, and easily acquire and catch processing fluid therein and thus contaminate a successive processing bath.

Although the contamination is prevented by rinsing the chucks 5 sufficiently in a cleaning bath, a large amount of cleaning fluid is necessary for satisfactory cleaning. Hence, increase in maintenance costs is inevitable.

Further, the substrates 2, being clamped in the chucks 5 by the holding plates 6 and hence under clamping pressures from the two sides toward their centers, are likely to be damaged on the rims.

In the device of FIGS. 26A–26C, further size reduction of the processing bath is achieved since the necessity of providing chucks for holding the substrates is eliminated, and hence, the processing bath needs not to be so wide to allow insertion of the chucks. Thus, the device of FIGS. 26A–26C is superior in that its processing bath is the smallest among the above three processing baths.

Another important advantage is that the device of FIGS. 26A–26C sees less chance of contamination. One reason is because the holding action of the substrates 2 does not require immersion of the holding poles 8 into the processing bath. The other reason is that the total area of the guide grooves 8a is smaller than that of the corresponding guide grooves of FIG. 25.

These advantages in the device of FIGS. 26A–26C are, however, outweighed by disadvantages. The substrates 2 could fall down on or drop off from the holding poles 8 during the horizontal transportation thereof since the substrates 2 are supported only from below by the three holding poles 8, which makes it difficult to convey the substrates 2 at a high speed. In addition, it is necessary to provide different vertical driving means to travel up and down the holding poles 7 for different processing baths, thereby inviting design complexity.

SUMMARY OF THE INVENTION

The present invention is directed to an apparatus for dipping substrates in a processing fluid.

According to the present invention, the apparatus comprises: (a) a processing bath for containing a processing fluid (b) supporting means provided in the processing bath for supporting the substrates; and (c) holding means for holding the substrates.

The holding means comprises (c-1) chuck means which comprises (c-1-1) first and second chucking frames hanging downward with a gap therebetween; (c-1-2) first and second holding members attached to respective bottom portions of the first and second chucking frames to be held substantially in a horizontal direction; and (c-1-3) guide means coupled to the first and/or second chucking frames to be held substantially in the horizontal direction at a level above the first and second holding members.

The first and second holding members have first and second side surfaces substantially facing each other on which first and second periodical linear arrays of first grooves capable of receiving respective bottom-side rims of the substrates are formed, respectively.

The guide means has at least one surface on which a periodical linear array of second grooves capable of receiving respective top-side rims of the substrates are formed, respectively.

Respective corresponding grooves in the first and second periodical linear arrays of the first grooves and the periodical linear array of the second grooves are aligned with each other so that the respective rims of the substrates can be received in corresponding first and second grooves.

The holding means further comprises (c-2) chuck driving means coupled to the first and second chucking frames for opening and closing the first and second chucking frames.

The apparatus further comprises (d) transporting means coupled to the holding means for lifting up and bringing down the holding means to put the substrates in and out of the processing fluid in the processing bath.

As herein termed, "a top-side rim" and "a bottom-side rim" of a substrate refer to portions of the rim of the substrate above and below a horizontal center line of the substrate, respectively.

The present invention is also directed to a method of removing substrates from a processing bath, wherein the substrates are supported on one end by a supporting tool provided in the processing bath.

According to the present invention, the method comprises the step of (a) obtaining a holder for holding the substrates.

The holder comprises a chuck mechanism including first and second chucking frames extending downward and having a gap therebetween; first and second holding members attached to the respective bottom portions of the first and second chucking frames to be held substantially in a horizontal direction; and guide members coupled to the first and/or second chucking frames to be held substantially in the horizontal direction at a level above the first and second holding members.

The first and second holding members have first and second side surfaces substantially facing each other on which first and second periodical linear arrays of first grooves capable of receiving respective rims of the substrates are formed, respectively.

Each of the guide members has at least one surface on which a periodical linear array of second grooves capable of receiving the respective rims of the substrates are formed, respectively.

Respective corresponding grooves in the first and second periodical linear arrays of the first grooves and the periodical linear array of the second grooves are aligned with each other so that the respective rims of the substrates can be received in corresponding first and second grooves.

The method further comprises the steps of: (b) opening the chuck mechanism to such an extent that the first and second holding members do not touch the substrates; (c) lowering the chuck mechanism into the processing bath; (d) stopping the movement of the chuck mechanism at a position below a predetermined holding position of the substrates; (e) closing the chuck mechanism thereby allowing the first and second periodical linear arrays of the first grooves to engage the bottom-side rims of the substrates and the periodical linear array of the second grooves to engage the top-side rims of the substrates; and (f) raising the chuck mechanism together with the substrates.

The present invention is further directed toward a method of supporting substrates end up and equidistant from each other in a processing bath.

According to the present invention, the method comprises the steps of: (a) providing, in the processing bath, first and second supporting rods disposed in parallel and each having a periodical linear array of first grooves having the same array period; (b) providing, in the processing bath, an aiding rod between and parallel with the first and second supporting rods, the aiding rod having a periodical linear array of second grooves which has the same array period as the first and second periodical linear arrays of the first grooves; (c) supporting the first and second supporting rods and the aiding rod approximately horizontal at respective predetermined positions within the processing bath; (d) introducing the substrates on end into the processing bath; and (e) inserting respective rims of the substrates into the corresponding first and second grooves so that a bottom of each second grooves does not touch the rim of a corresponding substrate, to thereby support the substrates in the processing bath.

According to the present invention, since the substrates are scooped up from below and held by the first and second holding members, no unnecessary pressure acts on the substrates at the rims. Thus, the rims of the substrates are not damaged. In addition, an amount of a processing fluid carried by the holding members is substantially reduced since each holding member has a reduced surface area. Hence, the present invention requires less maintenance costs for the cleaning process.

Further, being disposed above the center line of the substrates, the guide means prevents substrates from falling without damaging the rims of the substrates, making it possible to transfer the substrates at high speed.

Since the substrate holding portions of the chucks of the holding means is formed by only the first and second holding members and the guide members for preventing the substrates from falling, the chucks need to open or close only within a minimum necessary range to hold the substrates. This produces the following effects: the capacity of the processing bath is minimized; and the amount of processing fluid and processing time are reduced. Hence, reduction in maintenance costs and enhancement in productivity are promised.

Still another advantage is a reduced possibility of bath-to-bath contamination. The substrates are held by only the first and second holding members and the guide member, and therefore, any amount of processing fluid carried to a next successive processing bath is very small. Hence, the present invention sees less chance of contamination. Even if the first and second holding members and the guide member are to be cleaned before the next immersion in a processing bath, cleaning time of these elements is quite short.

Accordingly, an object of the present invention is to offer a dip-type substrate processing apparatus which promises stable holding of the substrates in a processing bath and high speed transfer of the substrates with a simple structure.

These and other objects, features, aspects and advantages of the present invention will become more apparent from the following detailed description of the present invention when taken in conjunction with the accompanying drawings.

BRIEF DESCRIPTION OF THE DRAWINGS

FIG. 9 is a side view showing the substrate supporting implement of FIG. 8 as attached to a processing bath;

FIG. 11 is an explanatory diagram illustrating how a substrate is prevented from rotating by the aiding member of FIG. 10;

FIG. 13 is a side view showing the substrate supporting implement of FIG. 12 as attached to a processing bath;

FIG. 17 is a side view of a fifth preferred embodiment of a substrate supporting implement;

FIG. 18A is a vertical front view of the substrate supporting implement of FIG. 17;

FIG. 18B is a vertical cross-sectional view of FIG. 18A as viewed along lines B—B;

FIGS. 26A–26C show a structure of a third example of a conventional substrate holding device.

DESCRIPTION OF THE PREFERRED EMBODIMENTS

Dip-type apparatuses for processing substrates according to preferred embodiments of the present invention will be described in the following with reference to the corresponding drawings.

Figure 1:
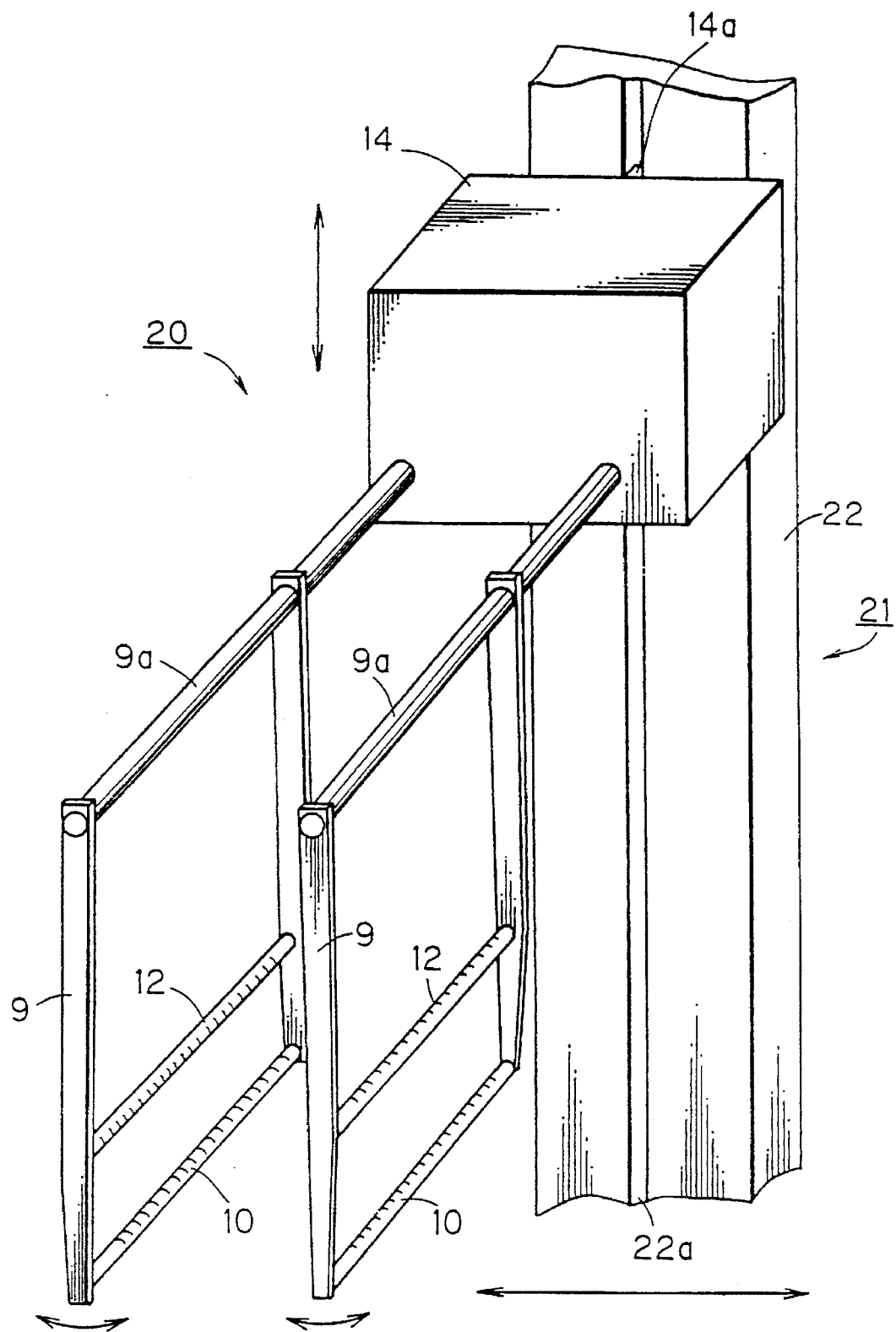
FIG. 1 is a perspective view showing one embodiment of a substrate holding device of a dip-type apparatest for processing substrates.

FIG. 1 is a perspective view showing one embodiment of a substrate holding device 20 of a dip-type apparatus for processing substrates.

The substrate holding device 20 comprises a pair of chucks 9 each fixed to a rotation shaft 9a which is axially supported for free rotation by a head 14.

The head 14 has on its back surface an engaging member 14a which is slidably inserted in a rail groove 22a formed on a vertical member 22 of a substrate transporter 21. Hence, the substrate holding device 20 ascends or descends along the rail groove 22a.

Figure 2:
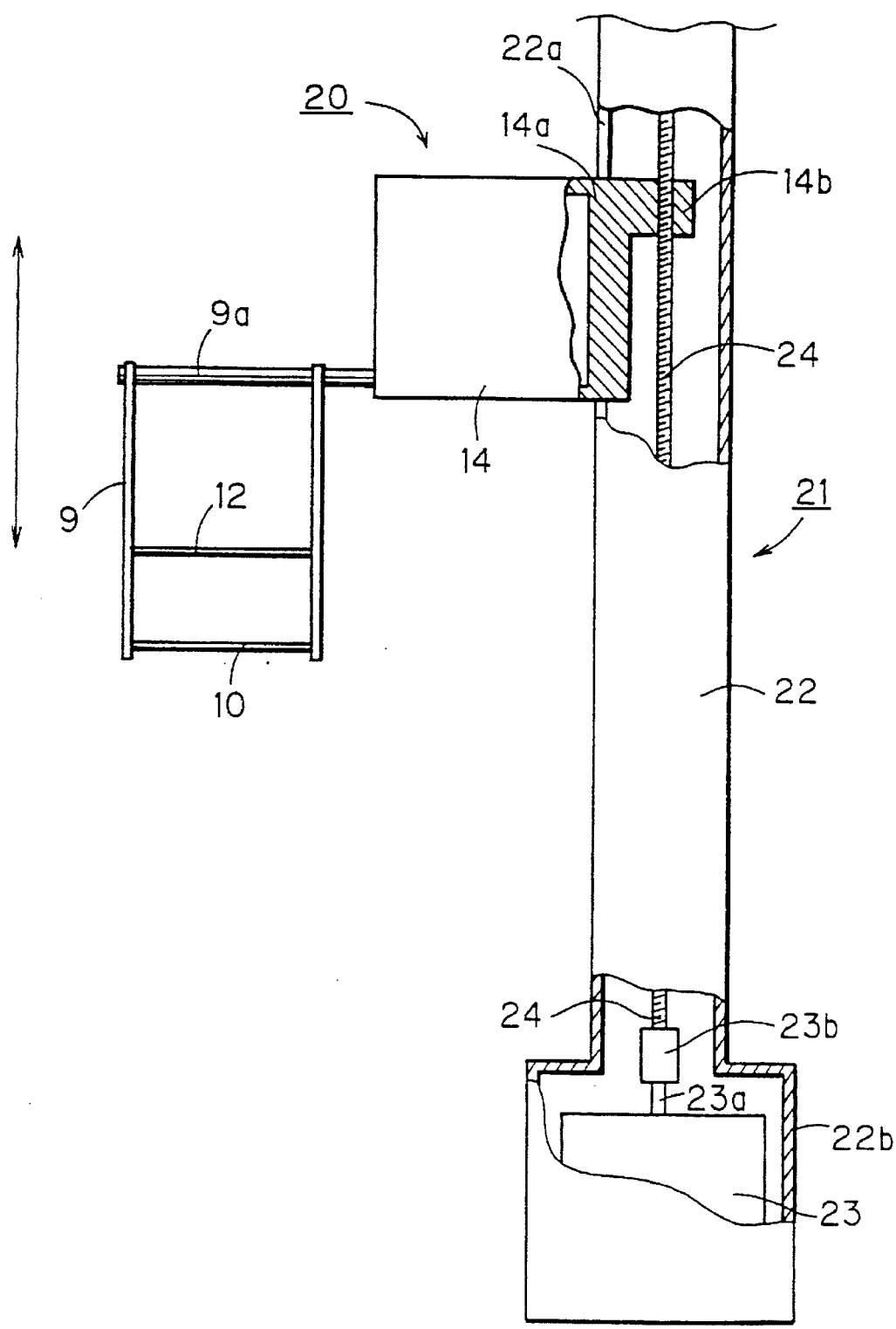
FIG. 2 is a partial vertical cross-section showing a structure of a vertical driving means of the substrate holding device.

FIG. 2 is a partial vertical sectional view showing the structure of vertical driving means for driving the substrate holding device 20 along the rail groove 22a.

A foot portion 22b of the vertical member 22 contains a motor 23. A rotation shaft 23a of the motor 23 is linked to a screw 24 through a joint 23b.

The engaging member 14a of the head 14 includes a screw hole 14b in which the screw 24 is screwed.

When the screw 24 is rotated by the motor 23, the head 14 is driven up or down by the screw rotation.

The screw 24 is preferably a ball screw in order to restrain particles which are created by friction between the screw 24 and the screw hole 14b.

The vertical driving means may be replaced with two pulleys, one disposed in an upper portion and the other in a lower portion of the vertical member 22, and a timing belt stretched about the pulleys, in which case the engaging member 14a is engaged with the timing belt. By rotatably driving one pulley by a motor and therefore running the timing belt, the head 14 is moved up or down.

The chucks 9 support holding poles 10 and aiding poles 12. The aiding poles 12 are disposed above and in parallel with the holding poles 10. Guide grooves are cut at fixed pitches on the inward surfaces of the holding poles 10 and the aiding poles 12.

With their rims inserted in the guide grooves, substrates 2 are held by the chucks 9 on one end.

Figure 3:
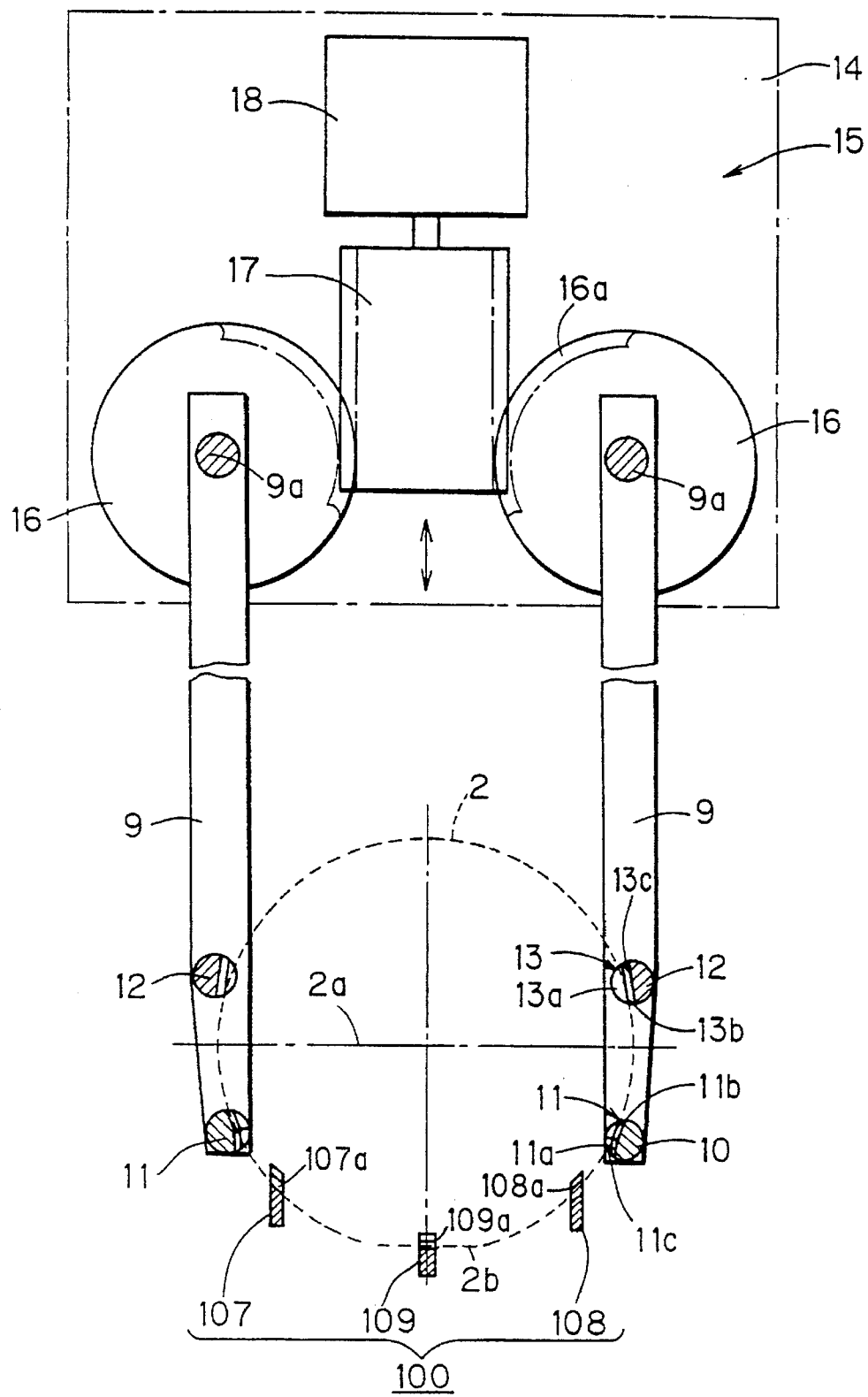
FIG. 3 is an essential vertical cross-section showing of the substrate holding device of FIG. 1.

FIG. 3 shows a vertical section showing the specifics of the substrate holding device 20 of FIG. 1.

Figure 4:
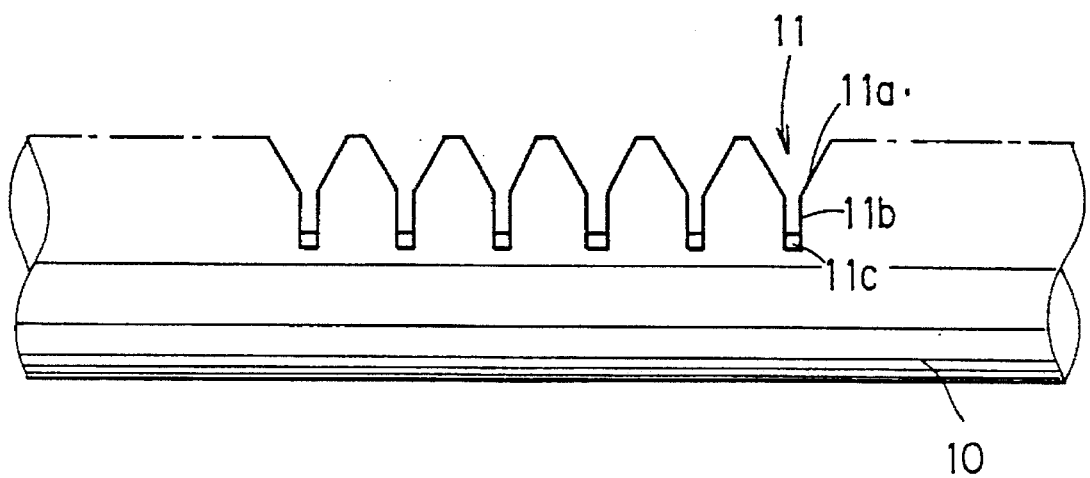
FIG. 4 shows the configurations of guide grooves notched on holding poles of the substrate holding device of FIG. 1.

The chucks 9 are provided at their bottom ends with the holding poles 10 in a direction extending perpendicular to the sheet of FIG. 3. Guide grooves 11 (FIG. 4) are cut in the inward surfaces of the holding poles 10 at regular pitches, in a number corresponding to the number of substrates to be held by the chucks 9.

Each guide groove 11 is formed by a tapered part 11a for guiding the rim of the substrate 2 and a holding groove 11b, and therefore, its cross-sectional configuration is like the letter Y. A bottom surface 11c of each holding groove 11b is generally a reverse V-shaped in cross-section to drain off processing fluid (FIG. 3).

The aiding poles 12, which act as a pair, are attached to the chucks 9 parallel to the holding poles 10 in such a manner that they extend above a horizontal center line 2a of the substrate 2 when the substrates 2 are held in the guide grooves 11 of the holding poles 10. Hence, the aiding poles 12 prevent the substrates 2 from falling down.

Guide grooves 13 are formed on the inward surfaces of the aiding poles 12 in alignment with the guide grooves 11. The guide grooves 13 are similar to the guide grooves 11 in that they each include a tapered part 13a and a holding groove 13b.

A bottom surface 13c of each guide groove 13 is flat as shown in FIG. 3. When the substrates 2 are held by the holding poles 10, the rims of the substrates 2 and the bottom surfaces 13c have a small space therebetween.

It is understood that the guide grooves 11 and 13 may have a V- or U-shaped or the-like cross-section.

The chucks 9 are linked at their top end portions to chuck driving means 15 which consists of toothed driving wheels 16, a rack 17 and an actuator 18. Each toothed wheel 16 is axially fixed to a rotation shaft 9a of its associated chuck 9. Pinions 16a are provided over a part of the peripheries of the toothed driving wheels 16. The rack 17 meshes with the pinions 16a. The actuator drives the rack 17 up or down, thereby opening or closing the chucks 9.

During operation, some members are dipped in processing fluids and some members are stained with a splash of the processing fluid; for example, the chucks 9, the rotation shafts 9a, the holding poles 10, the aiding poles 12 and the head 14. Hence, such members are made of resin which is not corroded by the processing fluids.

In the processing bath, the substrates 2 are supported in a standing-on-end state by a substrate supporting implement 100 comprising supporting rods 107 and 108 which function as a pair, and an aiding rod 109 which is provided midway therebetween. The function of the supporting rods 107 and 108 is to support the substrates 2 while that of the aiding rod 109 is to prevent the substrates 2 from falling down. The substrate supporting implement 100 will be described later in more detail.

Next, a method of holding the substrates 2 by the substrate holding device 20 within a processing bath 523 will be described. FIGS. 5A to 5D show the device 20 during successive stages (a) to (d) in the process of the holding action of the substrates 2.

Figure 5A:
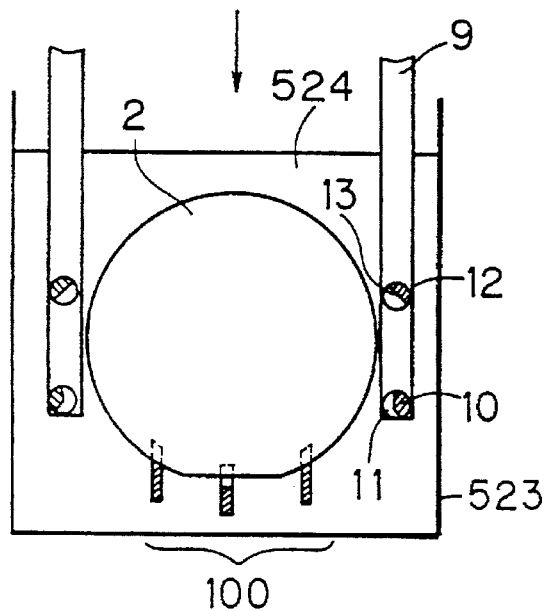
FIGS. 5A to 5D are explanatory diagrams illustrating the engagement of the substrate by the substrate holding device of FIG. 1.

At the stage (a) of FIG. 5A, the substrates 2 are supported parallel to each other as if standing on end by the substrate supporting implement 100 within the processing bath 523 which is filled with a preselected processing fluid 524.

The chucks 9 are opened to such an extent that the holding poles 10 and the substrates 2 are kept apart from each other. The vertical driving means of FIG. 2 is then driven to move the substrate holding device 20 down, and the chucks 9 are inserted into the processing bath to a position a little lower than the holding position of the substrates 2.

Figure 5B:
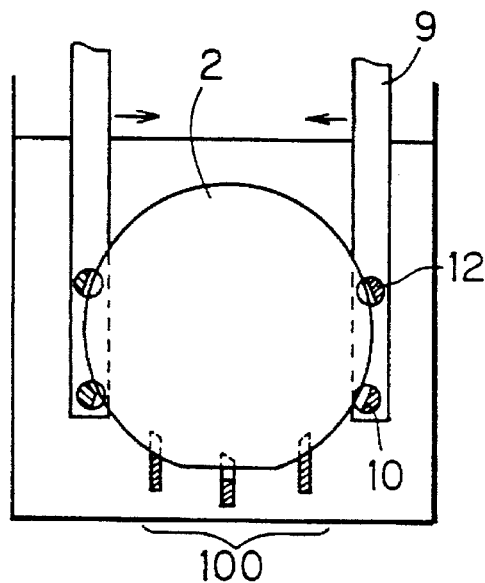

At the stage (b) of FIG. 5B, the chucks 9 are closed so that the rims of the substrates 2 slide into the guide grooves 11 of the holding poles 10 and the guide grooves 13 of the aiding poles 12. The bottom surfaces 11c and 13c of the guide grooves 11 and 13 (FIG. 3) have not yet been allowed to contact the rims of the substrates 2.

Figure 5C:
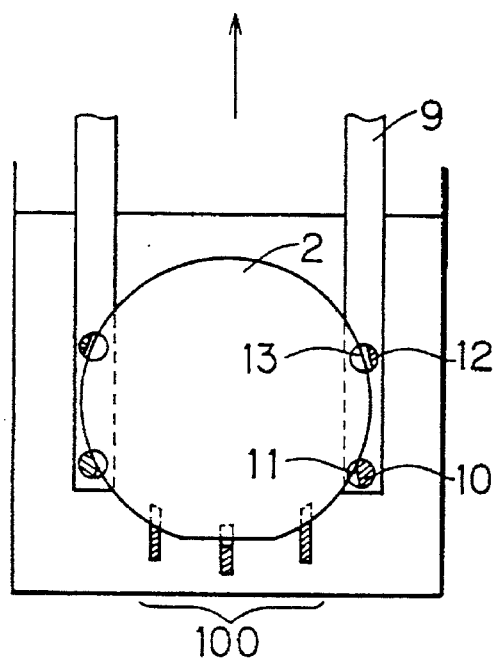

At the stage (c) of FIG. 5C, the chucks 9 are then lifted up. This causes the bottom surfaces 11c of the guide grooves 11 notched on the holding poles 10 to contact the bottom rims of the substrates 2. However, the bottom surfaces 13c of the guide grooves 13 notched on the aiding poles 12 are still off the rims of the substrates 2. The guide grooves 13 are in contact with the rims of the substrates 2 only at the side walls of the holding grooves 13b, which is enough to help keep the substrates 2 standing on end.

Figure 5D:
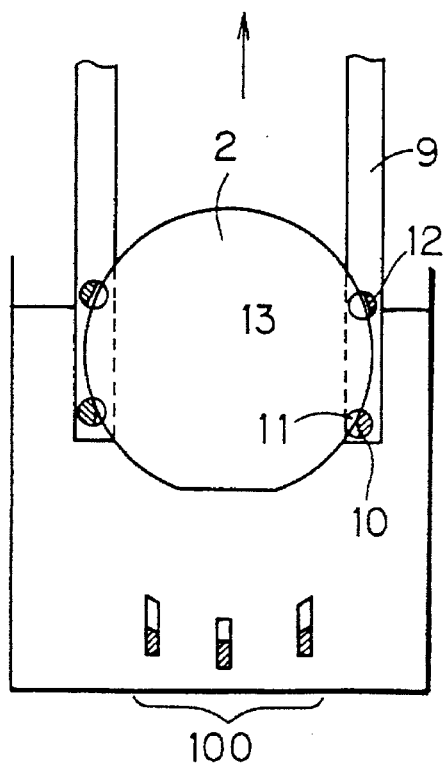

At the stage (d) of FIG. 5D, the chucks 9 are lifted up further. As a result, the substrates 2, as they are held by the holding poles 10, are removed from the substrate supporting implement 100 and taken out of the processing bath 523.

The holding method as described above is advantageous in that the chucks 9 need to be opened only a small amount since they are almost straight without a curve in configuration. Hence, it is possible to reduce the widths of the processing bath 523 in a direction of the major surfaces of the substrates 2. Such reduction in width in turn reduces the capacity of the processing bath 523, and hence, lessens various maintenance costs including the costs necessary for the processing fluids.

In addition, since the substrates 2 scooped up from below and held by the holding poles 10 are steady between the holding poles 10 due to their own weights, no unnecessary pressure acts on the substrates 2 at the rim. Thus, the substrates 2 would not be damaged.

The advantages as above are joined with still another advantage that high speed transportation of the substrates 2 is possible. This is because upper rims of the substrates 2 are guided by the guide grooves 13 of the aiding poles 12 lest the substrates 2 should fall down in any direction. Further, the guide grooves 13, in loose engagement with the substrates 2, would not press the rims of the substrates 2 against their centers. Thus, damage of the substrates 2 due to the on-the-rim pressure is decreased.

By adjusting the position to which the chucks 9 are lowered and how wide the chucks 9 are to be opened, the substrate supporting device 20 of this embodiment is capable of handling other substrates which differ in diameter from the substrates 2. Thus, there is no need to exchange the chucks 9.

Figure 6:
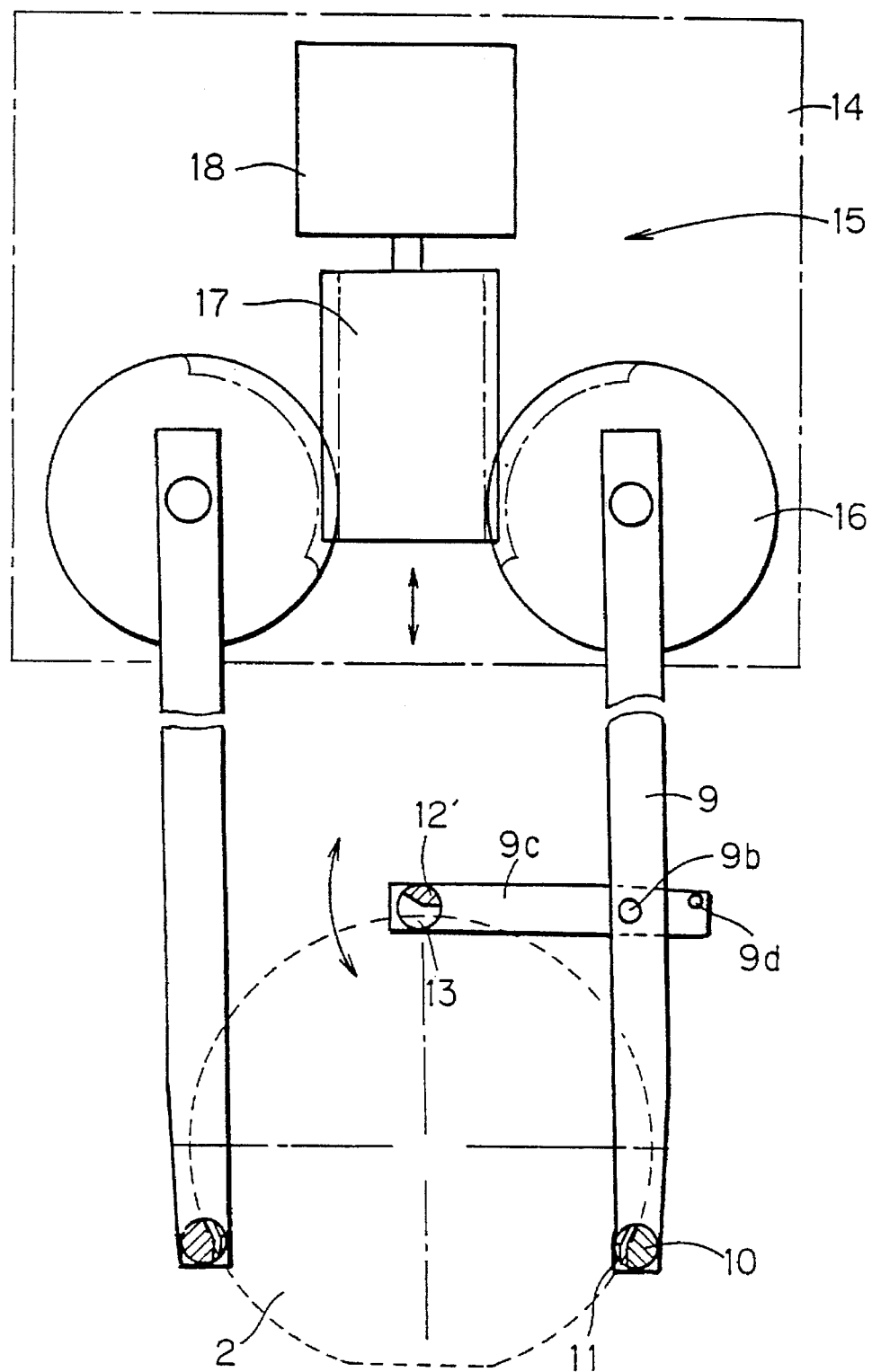
FIG. 6 is a diagram showing another embodiment of a substrate holding device.

Another embodiment of a substrate holding device is illustrated in FIG. 6.

Unlike in the device of FIG. 2, an aiding pole 12' is not directly attached to the chucks 9 in the device of FIG. 6. The aiding pole 12' is horizontally mounted to an end portion of a swing arm 9c which is attached to the chucks 9 for free rotation about a rotation shaft 9b.

The swing arm 9c must also be anti-corrosive to a preselected processing fluid. The swing arm 9c must be also made of material which has a larger specific gravity than the preselected processing fluid, or alternatively, a weight may be attached to the swing arm 9c.

A pin 9d is attached to the swing arm 9c. The absence of the substrates 2 in the substrate holding device 20 allows the swing arm 9c to sink. If the swing arm 9c has sunk a predetermined angle, the pin 9d will hit the right side edge of the chuck 9. Because of the engagement between pin 9d and the chuck 9, the swing arm 9c will not sink more than it should.

Thus, in the substrate holding device according to this embodiment, the swing arm 9c and the aiding pole 12' are not so heavy that they would weigh upon and damage the substrates 2 in any way. In addition, the swing arm 9c and the aiding pole 12', supporting the substrates 2 from almost right above, efficiently prevent the substrates 2 from falling down. Further, since the swing arm 9c sways to meet a positional change of the top rims of substrates, the substrate holding device 20 can handle substrates of a smaller or a larger diameter without exchanging the chucks 9.

Figure 7:
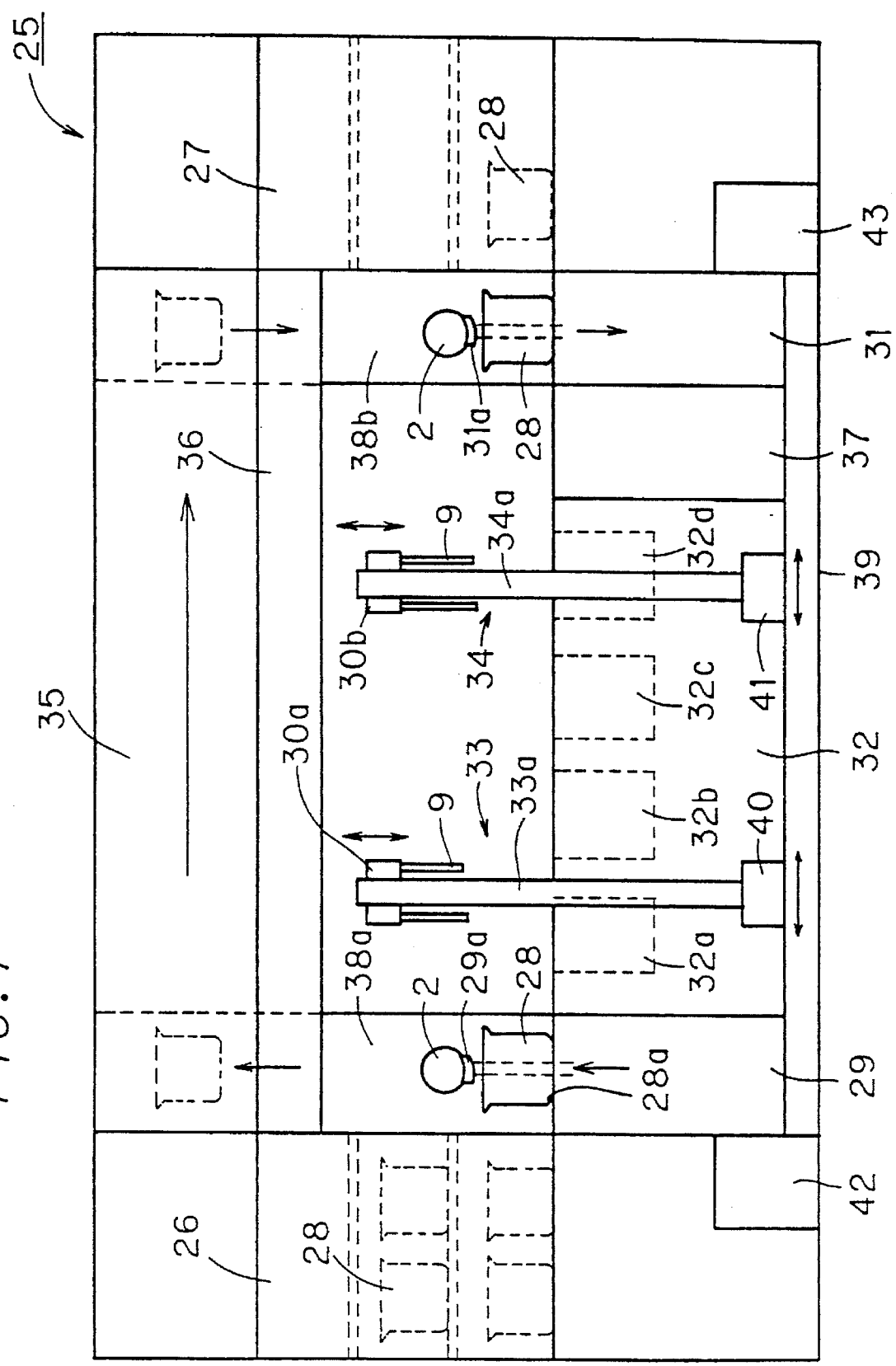
FIG. 7 is a diagram showing an overall structure of a dip-type substrate processing apparatus of the present invention.

FIG. 7 is a schematic front view of a dip-type substrate processing apparatus 25 incorporating the above substrate holding device 20.

The apparatus 25 comprises a carrier stocker 26 on one side and a carrier stocker 27 on the opposite side. The carrier stocker 26 contains carriers 28 filled with unprocessed substrates 2, while the carrier stocker 27 contains carriers 28 filled with processed substrates 2.

At a loading unit 29, the substrates 2 are taken out of the carriers 28 and loaded into a substrate holding device 30a, which is structured as heretofore described. The opposite to this is accomplished at an unloading unit 31 where the processed substrates 2 are returned into the carrier 28 by a substrate holding device 30b.

Processing baths 32a, 32b, 32c and 32d are housed in a processing unit 32. Exhaust ducts (not shown) are installed around the processing baths.

A drying unit 37 is equipped with a known spin dryer. The spin dryer dries the substrates 2 by spinning them in planes including of the major surfaces of the substrates 2 at a high speed, during which processing fluid dwelling on the surfaces of the substrates 2 is blown off by centrifugal force.

On the front side of the processing unit 32, vertical members 33a and 34a of transportation devices 33 and 34 are seated in base members 39, respectively, for free lateral slide movement.

The substrate holding devices 30a, and 30b, heretofore described in relation to FIG. 1, are installed on the vertical members 33a and 34a, respectively, and vertically slide thereon. Vertical driving devices 40 and 41 drive the substrate holding devices 30a, and 30b to ascend or descend.

The transportation device 33 is responsible for the transportation of the substrates 2 between the loading unit 29 and the processing baths 32a, 32band 32c. The transportation device 34 provides transportation of the substrates 2 between the processing bath 32c and 32d, the spin drying unit 37 and the unloading unit 31. Lateral driving devices 42 and 43 drive the transportation devices 33 and 34, respectively, to slide both in a lateral direction.

The lateral driving devices 42 and 43 may each include a timing belt which is run in a lateral direction and a motor for rotating the same, in which case the timing belts are engaged with the vertical members 33a and 34a. Any other known lateral driving means, of course, may be used.

Empty carrier feed unit 35 is provided above the processing unit 32. The empty carrier feed unit 35 includes a belt conveyer (not shown) which conveys empty carriers 28 from above the loading unit 29 to above the unloading unit 31.

Under the empty carrier feed unit 35, a ventilation unit 36 is disposed which creates a downward air flow, and poisonous gas is expelled from the exhaust ducts beneath.

Pipes are provided on the back of the processing unit 32. Processing fluids flow into and out of the processing baths through these pipes. Carrier transporting means 38a and 38b are mounted on the back side of the loading unit 29 and the unloading unit 31, respectively. The structures of the carrier transporting means 38a and 38b are not illustrated and can be any conventional transporting means capable of carrying and feeding the carriers 28 to desired positions.

Next, the operation of the dip-type apparatus 25 for processing the substrates will be described.

First, the carrier transporting means 38a takes the carriers 28 out of the carrier stocker 26 and loads the carriers 28 into the loading unit 29. Since guide grooves are notched at fixed pitches on the inner surfaces of the carriers 28, the substrates 2, with their rims inserted in the guide grooves, stand on end within each carrier 28.

An oblong hole 28a for transfer is punched into the bottom of each carrier 28. The substrate holder 29a has guide grooves formed at the same intervals as the guide grooves of the carrier 28. Hence, by pushing up the substrate holder 29a for loading into the carrier 28 through the hole 28a, the substrates 2 are taken out of the carrier 28 by the substrate holder 29a.

In response to this, the transportation device 33 moves in front of the loading unit 29, holds the substrates 2 by substrate holding device 30a, and slides toward the processing unit 32.

The carrier 28 now containing no substrates is conveyed by the carrier transporting means 38a to the empty carrier feed unit 35, and thence to above the unloading unit 31 by the belt conveyer (not shown) of the empty carrier feed unit 35.

The empty carrier 28 is then inserted in the unloading unit 31 by the carrier transporting means 38b.

The transportation devices 33 and 34 coact to complete processing of the substrates 2. More precisely, the substrates 2 are inserted into the processing baths 32a, 32b, 32c and 32d in succession from one bath to the next. The substrates 2 undergoing the surface processing are dried at the drying unit 37 and fed to the unloading unit 31 where they are transferred onto a substrate holder for unloading 31a which is pushed up above the carrier 28 through the oblong hole 28a.

The substrate holder 31a then descends while holding the substrates 2 so that the processed substrates 2 are returned into the carrier 28.

The carrier 28 now containing the processed substrates 2 is then carried to the carrier stocker 27 by the carrier transporting means 38b, thereby completing the processing.

If the loading unit 29 includes a known device for trueing up the edges of the substrates, the substrates 2 each having an orientation flat are processed uniformly same in the apparatus 25. In processing substrates 2 having orientation flats, the substrates 2 are arranged at the loading unit 29 so as to place the orientation flats at the bottom.

As to the processing baths, a larger number of processing baths may be used if necessary. More transportation devices 33 and 34 may be disposed to adapt to the increase in the number of the processing baths.

If circumstances demand, chuck cleaning baths may be disposed between the processing baths. By cleaning the chucks after every immersion in processing fluid, less contamination can be achieved.

As described earlier, the processing apparatus 25 requires less plane space since the empty carrier feed unit 35 is disposed above the processing unit 32. This also means that the front and the rear spaces of the empty carrier feed unit 35 are not occupied by the feed unit 35 for carrying empty carriers, promising easier maintenance of not only the processing unit 32 but also the pipes for leading the processing fluids into and out of the processing baths.

The provision of the feed unit 35 above the processing unit 32 creates another advantage. That is, only the carrier transporting means 38a and 38b, each moving in a vertical direction within the same plane, are in charge of transfer of the substrates 2 between the carrier stockers 26 and 27, the loading and the unloading units 29 and 31, and the empty carrier feed unit 35. This enables full use of the carrier-less approach and gives the processing apparatus 25 a surprising processing efficiency.

In addition, various meritorious effects are produced by the structure of the substrate holding devices 30a, and 30b which allows the opening action of the chucks 9 to hold the substrates 2 is restrained to the minimum necessity. The processing baths, and hence, the whole substrate processing system are reduced in size. Substantial reduction is also achieved in the quantity of processing fluids and the length of the cleaning time. Hence, the substrate processing system is less costly in terms of maintenance costs. With the reduction in the cleaning time, the total processing time is shortened as well. Thus, the substrate processing apparatus 25 is superior to the conventional apparatuses in many aspects.

The substrate holding devices 30a, and 30b, each comprising the aiding poles disposed for the purpose of preventing the substrates from falling down, promise still another merit that high speed transportation of the substrates is possible since the substrates will not drop off or fall down during transportation. This ensures even greater reduction in the processing time.

The cross-section of the holding poles 10 and the aiding poles 12 mounted to the chucks 9 are not limited to being round as heretofore disclosed. However, to drain off the processing fluids, a round shape or a similar shape is desirable. Needless to say, the configurations of the bottom surfaces 11c and 13c of the guide grooves are not limited to as disclosed earlier, either.

It is also understood that the chuck driving means 15 need not be the aforementioned pinion-rack combination but may be any other known chuck driving mechanism. Still other possible modification of the chuck driving means 15 relates to the actuator which can be an aerodynamic, hydraulic type or screw feed type. On the other hand, the opening and the closing actions of the chucks 9 do not necessarily have to be attained by a rotation of the chucks 9 about the rotation shafts 9a, but can be achieved by lateral slide movement of the chucks 9.

In the following, the structure of the substrate supporting implement 100 for supporting substrates in a standing-on-end state within a processing bath will be described.

In order to hold the substrates 2 by the chucks 9, it is necessary to ensure that the substrates 2 stand on end in a processing bath. The substrates 2 must be held stably enough against disturbances such as flows of a processing fluid.

The substrate supporting implement 100 fully meets this demand. Supported by the substrate supporting implement 100, the substrates 2 firmly stand on end in the processing baths. In addition, the substrate supporting implement 100 will not block fluid flow even in processing baths equipped with the up-flowing function or the bubbling function. During processing of substrates with orientation flats, the substrate supporting implement 100 prevents the substrates from rotating within a processing bath, thereby promising uniform processing.

Figure 8:
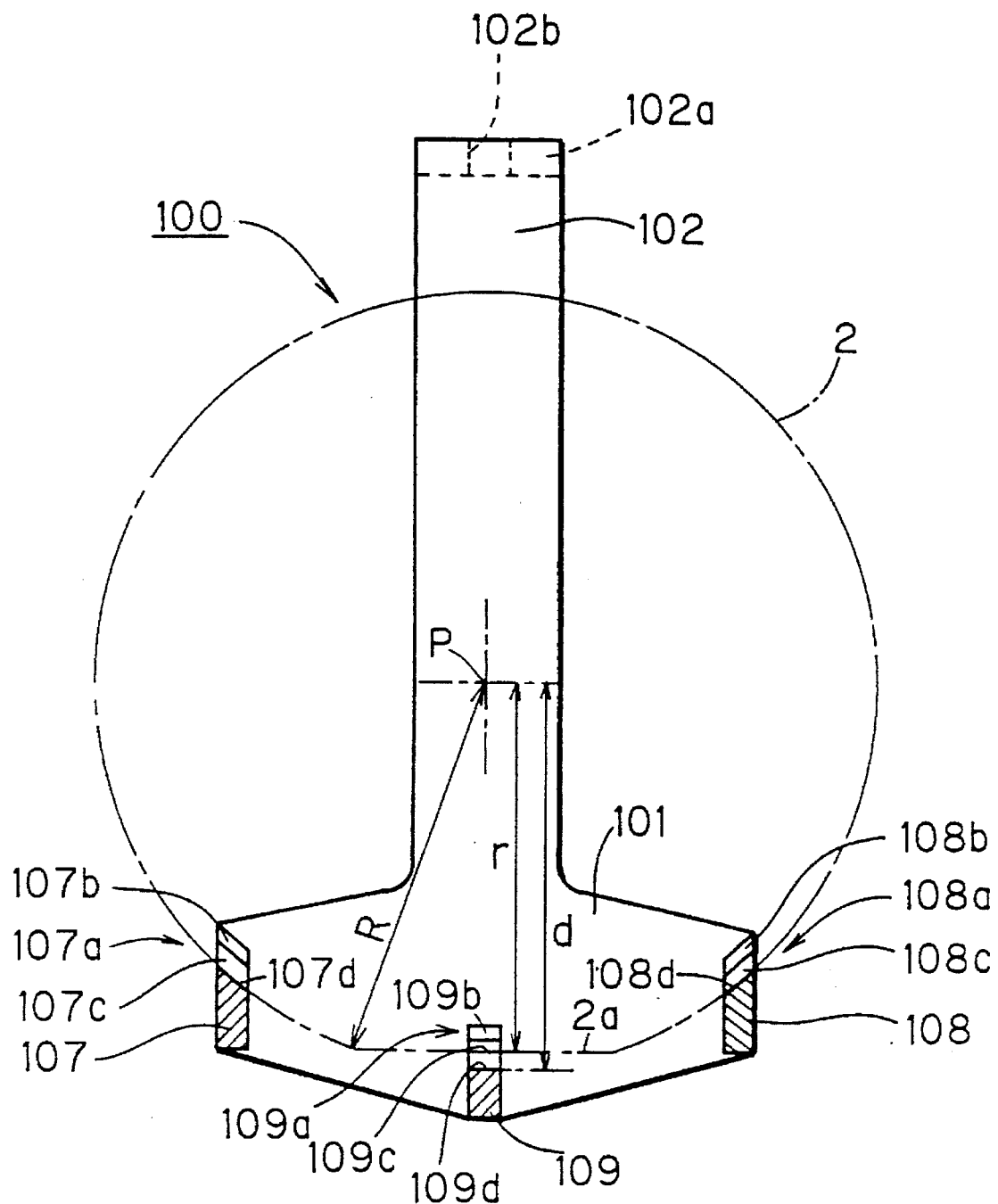
FIG. 8 is a vertical front view of a first preferred embodiment of a substrate supporting implement.

FIG. 8 is a vertical front cross-sectional view of the substrate supporting implement 100 (first preferred embodiment). FIG. 9 is a side view of the substrate supporting implement 100 as attached to a processing bath.

The substrate supporting implement 100 is formed by the supporting rods 107 and 108, which act as a pair, the aiding rod 109, a pair of base holding frames 101, and suspending members 102. The supporting rods 107 and 108 are disposed symmetrical to each other, and the aiding rod 109 is disposed nearly midway between the supporting rod 107 and 108. The base holding frames 101 support the supporting rods 107 and 108 and the aiding rod 109 in a horizontal direction. The base holding frames 101 are suspended from and integrated with the suspending members 102.

Guide grooves 107a, 108a and 109a are formed with equal pitches on the top surfaces of the rods 107, 108 and 109, respectively. The guide grooves 107a, 108a and 109a extend perpendicularly into the drawing sheet of FIG. 8.

The guide grooves 107a, 108a and 109a are formed equal in number and aligned with the guide grooves 11 and 13 which are notched on the holding poles 10 and the aiding poles 12 of the substrate holding device 20.

Figure 10:
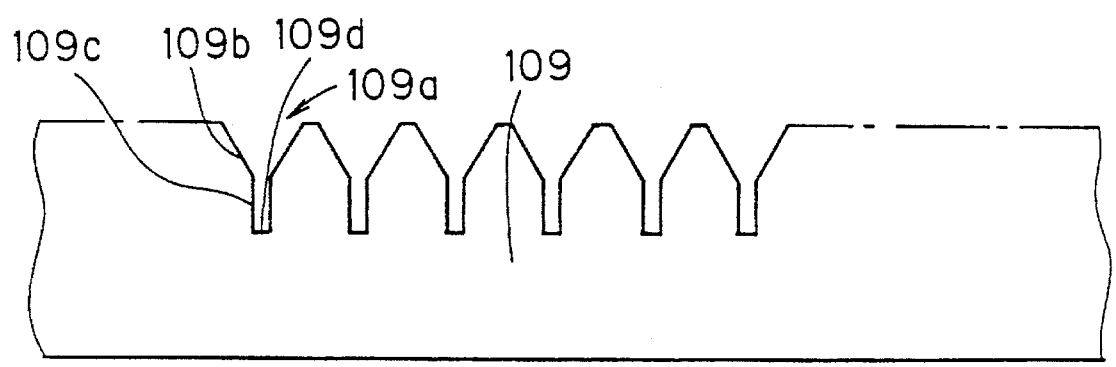
FIG. 10 is a diagram showing the configurations of guide grooves notched on an aiding member.

Each guide groove 109a as viewed in cross section looks like the letter Y as shown in FIG. 10, and includes a tapered part 109b, along which the rim of the substrate 2 is guided into the guide groove 109a, and a holding groove 109c by which the substrates are vertically held. A bottom surface 109d of the holding groove 109c is flat (FIG. 8).

Likewise the guide groove 109a, the guide grooves 107a and 108a are formed by tapered parts 107b and 108b and holding grooves 107c and 108c, respectively. One difference from the guide grooves 109a is that the bottom surfaces 107d and 108d are slanted downward as shown in FIG. 8 so as to adapt to the configuration of the rims of the substrates 2.

It is understood that the guide grooves 107a and 108a may have a V- or U-shaped or so-like shaped cross section.

An attachment part 102a is formed in the top portion of each suspending member 102. The substrate supporting implement 100 is fitted to the brim of a processing bath 111 via the attachment parts 102a. A fit hole 102b into which a bolt 112 is inserted is formed in each attachment part 102a.

By inserting the bolts 112 into screw holes 111a which are formed in the brim of the processing bath 111 as shown in FIG. 9, the suspending members 102 are firmly screwed to the processing bath 111. As a result, the supporting rods 107 and 108 and the aiding rod 109 are set at their desired positions within the processing bath 111.

Thus, since insertion of the bolts 112 alone is required to fix the substrate supporting implement 100 to the processing bath 111, the substrate supporting implement 100 is easily attached to and detached from the processing bath 111, which is a noteworthy convenience of the first preferred embodiment. This convenience is also appreciated when substrates of different diameters need to be processed in the processing bath 111 since the substrate supporting implement 100 is exchanged easily.

Next, the positional relation between the supporting rods 107 and 108 and the aiding rod 109 will be described.

As shown in FIG. 8, the substrate supporting implement 100 supports the substrates 2 with their orientation flats 2a at the bottom.

The supporting rods 107 and 108, which are disposed symmetrical to each other, are in contact with the lower rims of the substrates 2 at the bottom surfaces 107d and 108d of the guide grooves 107a and 108a.

The aiding rod 109 is disposed approximately in the center between the supporting rods 107 and 108. The bottom surfaces 109d of the guide grooves 109a of the aiding rod 109 are spaced a small distance from the orientation flats 2a of the substrates 2. To this extent, the aiding rod 109 only aids in preventing the substrates 2 from becoming inclined forward or backward with respect to the drawing sheet of FIG. 8.

Hence, even subjected to changing flows of a processing fluid or a cleaning fluid in the processing bath 111 during a special processing such as the up-flowing and the bubbling, the substrates 2 would not contact each other or fall down.

The depth of each guide groove 109a is determined so that a relation R>d>r is satisfied where P is a center of the substrate 2, R is a radius of the substrate 2, r is a distance between the center P and the straight edge of the orientation flat 2a and d is a distance between the center P and the bottom surface 109d of the guide groove 109a when the substrate 2 is held by the substrate supporting implement.

During special processing described above, the substrate 2 would rotate, for example, in the direction indicated by the arrow in FIG. 11, due to the rotational force created by a flow of a processing or a cleaning fluid. However, the straight edge of each orientation flat 2a would soon hit and come into engagement with the bottom surface 109d of each guide groove 109a at the point Q of FIG. 11. As a result, further rotation of the substrates 2 would not occur.

Hence, it is understood that the smaller the distance between the bottom surfaces 109d of the guide grooves 109a and the straight edges of the orientation flats 2a, the less the rotation of the substrates 2.

Thus, the aiding rod 109 has two functions. One is to assist in preventing the substrates 2 from leaning forward or backward as described earlier, and the other is to prevent external-force-induced rotation of the substrates 2.

Although the foregoing has described the substrate supporting implement 100 of the first preferred embodiment which allows only one aiding rod 109 to be disposed nearly halfway between the pair of supporting rods 107 and 108, the location of the aiding rod 109 is not limited as such. The aiding rod 109 may be disposed otherwise as far as its function to guide the orientation flats 2a is not lost.

Alternatively, two or more aiding rods may be used. In this modification, care must be taken lest the existence of the aiding rods should degrade the cleaning effect of the up-flowing or other processes.

The structure of supporting the substrates at only two points by the pair of supporting rods 107 and 108 does not demand so strict an accuracy in locating the supporting rods, which is not the case where substrates are supported at three points. Hence, the substrate supporting implement 100 of the first preferred embodiment is manufactured easily.

In addition, since guiding of the rims of the substrates 2 takes place below the supporting positions of the supporting rods 107 and 108, the substrates 2 are effectively prevented from falling down due to environmental disturbances such as flows of a processing fluid.

Another advantage is uniform processing of the substrates 2. The uniform processing is promised in a processing such as the up-flowing and the bubbling because a processing or a cleaning fluid flows freely from below between the supporting rods and the aiding rod.

Still another advantage is appreciated in the processing of substrates each having an orientation flat. The substrates are mounted to the substrate supporting implement so that their orientation flats are placed at the bottom and that a distance between the center of each substrate and the bottom surface of each guide groove of the aiding rod is smaller than the radius of the substrates, but larger than a distance between the center and the straight edge of the orientation flat of each substrate. Due to this, rotation force acting on the substrates simply causes the straight edges of the orientation flats to be urged against the bottom surfaces of the guide grooves notched on the aiding rod, thereby prohibiting rotation of the substrates. More advantageously, the substrates are kept inclined at the same angle. Hence, the substrates are processed uniformly.

During the process of transferring the substrates 2 from the substrate holding device 20 into the processing bath 111 and holding the substrates 2 by the substrate supporting implement 100, even a slight misregistration of the substrate supporting implement 100 to the processing bath 111 results in a failure of the lower rims of the substrates 2 to be properly inserted into the guide grooves of the substrate supporting implement 100.

Improper support of substrates 2 by the substrate supporting implement 100 causes the substrates 2 to lose a support when the chucks 9 are opened. As a result, the substrates 2 fall down and get damaged. In terms of both the quality and the yield of final products, such damage and resultant particles are fatal.

To force the rims of the substrates 2 into the guide grooves of the substrate supporting implement 100, however, will cause not only damage to the substrates 2 but also deformation of the holding poles 10 of the substrate holding device 20.

A solution to the above problem requires very accurate alignment of the guide grooves 11, which are cut into the holding poles 10 of the substrate holding device 20, with the guide grooves of the substrate supporting implement 100 before the substrates 2 are transferred from the substrate holding device 20 to the substrate supporting implement 100. Such alignment is cost and labor consuming since a special alignment mechanism is necessary and the alignment takes a long time even with such a special mechanism.

In the following, substrate supporting implements of a second to an eighth preferred embodiment will be described. Although the substrate supporting implement 100 requires, prior to the transfer of substrates, to accurately adjust the positional relationship between the guide grooves of the substrate supporting implement 100 and the guide grooves of the holding poles 10 of the substrate holding device 20, the improved substrate supporting implements of the second to eighth preferred embodiments, devised in light of the difficulty described above, are capable of automatically adjusting that positional relationship in at least a direction approximately perpendicular or approximately parallel to the major surfaces of the standing- on-end substrates.

Figure 12:
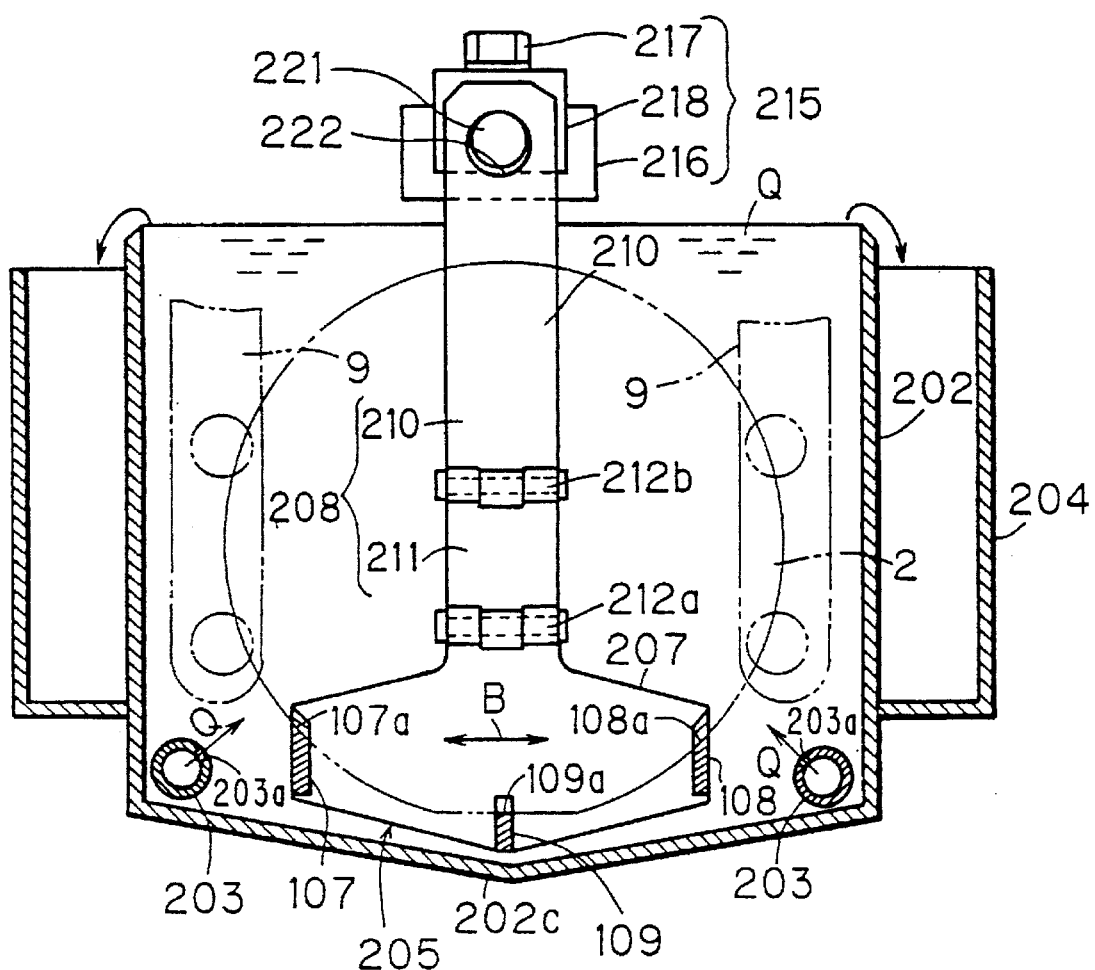
FIG. 12 is a vertical front view of a second preferred embodiment of a substrate supporting implement.

FIGS. 12 and 13 are a vertical front view and a vertical side view, respectively, showing a substrate supporting implement 208 (second preferred embodiment) as attached to an overflow type processing bath 202.

The processing bath 202 is made of quartz and integrated with a surrounding drain bath 204.

Unlike the substrate supporting implement 100 of FIG. 8, in which each base holding frame 101 and its associated suspending member 102 are integrated into one member, the substrate supporting implement 208 of the second preferred embodiment does not include an integrated construction (FIG. 12). That is, an upper suspending member 210 and an intermediate suspending member 211 are linked to each other by a hinge 212b, thereby forming a suspending member 208. Thus, two suspending members 208 are formed which act as a pair. Each suspending member 208 is linked to a base holding frame 207 by a hinge 212a.

Hence, it is possible to slide the supporting frames 207 in a direction approximately perpendicular to the major surfaces of the substrates 2 (i.e., the direction of the arrow A of FIG. 13).

The substrate supporting implement of FIG. 12 is similar to the substrate supporting implement 100 of FIG. 8 in that the supporting rods 107 and 108 and the aiding rod 109 are held by the base holding frames 207. A substrate supporting part 205 is formed by the base holding frames 207 and the supporting and the aiding rods 107, 108 and 109 which are held thereby.

Figure 14A:
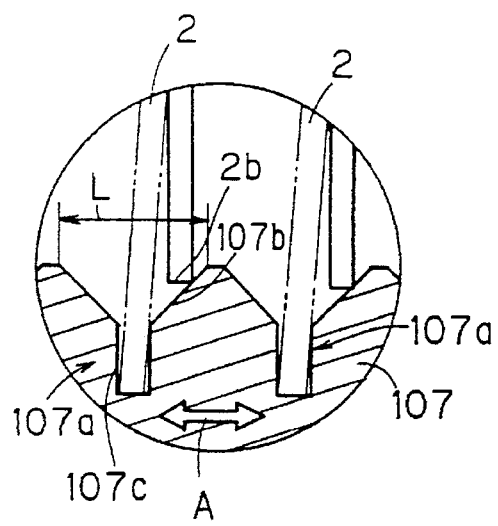
FIG. 14A is a vertical cross-sectional view showing the movement of a substrate holding part in a direction approximately perpendicular to major surfaces of substrates as supported end up.

FIG. 14A is an enlarged partial cross section of the supporting rod 107 receiving the substrates 2 from the substrate holding device 20.

As shown in FIG. 14A, the substrates 2 as held by the substrate holding device 20 are misaligned over the guide grooves 107a of the supporting rod 107 in the direction indicated by the arrow A within an allowable misalignment range L. As the substrate holding device 20 descends together with the substrates 2, the bottom rims 2b of the substrates 2 come into contact with the tapered parts 107b of the guide grooves 107a, thereby sliding the substrate supporting part 205 in the direction substantially perpendicular to the major surfaces of the substrates 2. Hence, the substrates 2 are smoothly inserted into the holding grooves 107c of the guide grooves 107a, and finally, supported in the standing-on-end state.

In short, what is done in a series of actions is to sway the hinges 212a and 212b to thereby correct the arrowed-direction misalignment between the guide grooves of the supporting and the aiding rods 107 to 109 of the substrate supporting part 205 and the guide grooves of the holding poles 10 of the chucks 9.

Considering the pitches of the guide grooves, the allowable misalignment range L is set to be about 1 to 2 mm.

A suspending unit 215 is linked to a top portion of each suspending member 210. The suspending units 215 each comprise a base member 216, an arm member 218, a swing-support shaft 221 and an arm insertion hole 222 which is punched into the associated suspending member 210. The base members 216 are secured to a base frame (not shown). The arm members 218 are fixed to the respective base members 216 for free sideways adjustment. The swing-support shafts 221 protrude from the free edge of the respective arm member 218. Comprising these elements, the suspending units 215 ensure that the suspending members 208 and the base holding frames 207 freely swing in a direction approximately parallel to the major surfaces of the substrates 2 if held as standing on end.

Figure 14B:
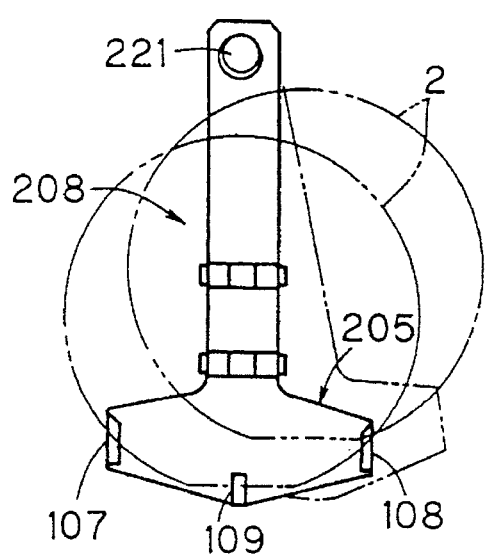
FIG. 14B is a front view showing how the substrate supporting implement sways along the major surfaces of the substrates.

Hence, as shown in phantom in FIG. 14B, even if the substrate supporting part 205 is a little misaligned, in the direction approximately parallel to the major surfaces of the standing-on-end substrates 2, to the substrates 2 which have been transferred by the substrate holding device 20, the misalignment of the substrate supporting part 205 is corrected by swaying the suspending members 208 (solid lines). As a result, the substrates 2 are inserted into the guide grooves 107a, 108a and 109a of the substrate supporting part 205 as desired and supported in the standing-on-end state.

In other words, what is done here is to sway the substrate supporting part 205 through the substrates 2 which are held by the chucks 9 to thereby correct the misalignment between the guide grooves of the supporting and the aiding rods 107 to 109 and the guide grooves 11 of the holding poles 10 of the substrate holding device 20 in the direction approximately parallel to the major surfaces of the substrates 2.

The bottom wall 202c of the processing bath 202 has a configuration like the bottom of a ship. Two supply pipes 203 are disposed in the processing bath 202 in order to pipe processing fluids such as a cleaning fluid into the processing bath, one along the right corner and the other along the left corner of the bottom wall 202c, i.e., in a direction perpendicular to the drawing sheet of FIG. 12. The supply pipes 203 lead outside the processing bath 202 and are connected to a processing fluid supply unit 230 (FIG. 13). A processing fluid Q such as pure cleaning water rushes into the processing bath 202 toward the substrates 2 through jet outlets 203a of the supply pipes 203, thereby creating an upwardly rushing flow of the processing fluid Q. Excess processing fluid Q flows over the brim of the processing bath 202.

In order to ensure that excess of the processing fluid Q runs evenly over the brim of the processing bath 202, the brim of the processing bath 202 must be horizontal. One approach to keep the processing bath 202 horizontal is disclosed in Japanese Laid-Open Gazette No. 4-15232 by the inventor of the present invention. The technique disclosed in the gazette, entitled "A dip-type substrate processing apparatus," involves reinforcing the bottom of the processing bath 202 with an anti-corrosion plate and adjusting the location of the anti-corrosion plate by a plurality of tools for vertical adjustment and support. Screws, for example, may be used as such tools.

The processing fluid Q floods into the drain bath 204 through which it is collected. The processing fluid Q is thereafter refined for reuse. The overall quantity of the processing fluid Q thus circulated for reuse is reduced since the generally V-shaped cross section of the bottom wall 202c, which is adapted to accommodate the configuration of the substrates, has reduced the capacity of the processing bath 202.

The general V-shape of the bottom wall 202c also enables easy maintenance of the bottom wall 202c such as cleaning of the inner bottom surface of the processing bath 202.

The processing bath 202 and the drain bath 204 may not be integrated into one body unlike as heretofore disclosed. In addition, the processing bath 202 needs not be made of quartz. Tetrafluorethylene, for example, which has excellent anti-corrosiveness, is also a good candidate.

Still another modification is possible as to the correction of the guide-groove/substrate misalignment.1896XAs described before, the suspending member 208 and the suspending unit 215 form relocating means. When transferring the substrates 2 from the chucks 9 to the suspending units 215, the relocating means amends misalignments between the guide grooves of the substrate supporting part 205 and the guide grooves of the chucks 9 in directions approximately perpendicular and parallel to the major surfaces of the standing-on-end substrates 2. However, the relocating means may correct only one of the vertical and the lateral misalignments.

Figure 15:
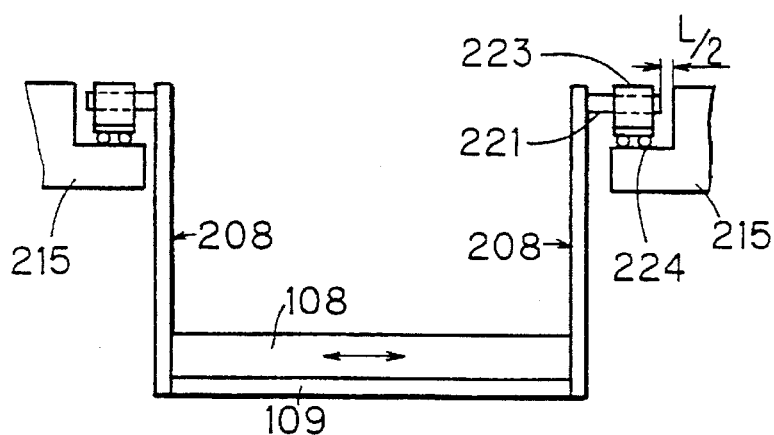
FIG. 15 is a side view of a third preferred embodiment of a substrate supporting implement.

FIG. 15 is a side view of a substrate supporting implement according to a third preferred embodiment of the present invention.

Different from the second preferred embodiment where each suspending member 208 can be divided into the intermediate suspending member 211 and the upper suspending member 210, the suspending members 208 of the third preferred embodiment are each one piece. Each suspending member 208 is provided at the top portion thereof with a swing-support shaft 221 which is axially mounted for free swaying to a thrust bearing 223. Rollers 224 are mounted to each thrust bearing 223, ensuring lateral slide of the thrust bearing 223 within a predetermined slide range L/2 in the axial direction of the swing-support shafts 221, i.e., in a direction approximately perpendicular to the major surfaces of the standing-on-end substrates 2. The substrate supporting implement of the third preferred embodiment is otherwise similar to the substrate supporting implement of the second preferred embodiment.

Figure 16B:
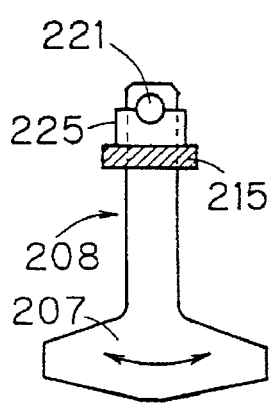
FIG. 16B is a front view of FIG. 16A as viewed along lines B—B.
Figure 16A:
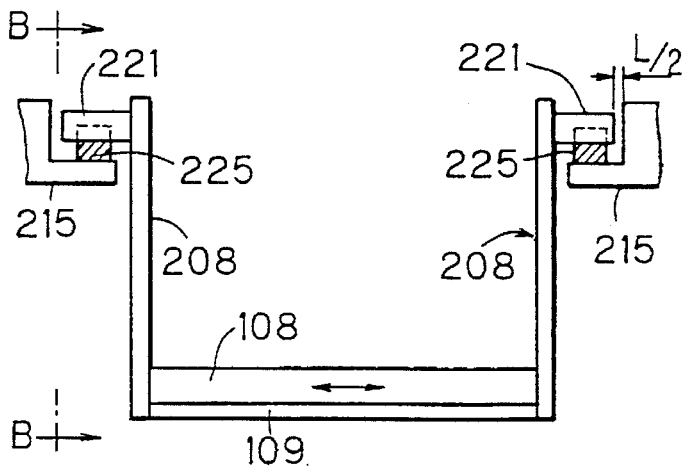
FIG. 16A is a side view of a fourth preferred embodiment of a substrate supporting implement.

FIG. 16A is a side view of a substrate supporting implement according to a fourth preferred embodiment of the present invention. FIG. 16B is a front view of the substrate supporting implement of FIG. 16A as viewed along the line B—B. For clarity of illustration, FIG. 16A shows a thrust bearing 225 in cross section.

Instead of the bearings 223 and the rollers 224 of the third embodiment, the fourth preferred embodiment uses half-cut thrust bearings 225 secured to the suspending unit 215. The half-cut thrust bearings 225 each have a configuration which is obtained by omitting the upper half portion of a regular bearing. The swing-support shafts 221 carried in the thrust bearings 225 are therefore supported for free slide movement, within a predetermined slide range L/2, in a direction approximately perpendicular to the standing-on-end substrates 2.

Using the half-cut thrust bearings 225, the substrate supporting implement is attached to and detached from the suspending unit 215 in a simple manner. Hence, maintenance the substrate supporting implement is easier.

The substrate supporting implement of the fourth preferred embodiment is otherwise similar to the substrate supporting implement of the the third preferred embodiment.

FIG. 17 is a perspective view of a substrate supporting implement according to a fifth preferred embodiment of the present invention. FIG. 18A is a vertical front view of the substrate supporting implement of FIG. 17, and FIG. 18B is a vertical side view of FIG. 18A as viewed along the lines B—B.

As shown in FIG. 18A, the guide grooves 107a, 108a and 109a are notched on the supporting rods 107 and 108 and the aiding rod 109 at fixed intervals. When inserted into the guide grooves 107a, 108a and 109a, the substrates 2 are supported on end. The pitches of the guide grooves 107a, 108a and 109a are the same as those of the guide grooves cut on the holding poles 10 and the aiding poles 12 of the substrate holding device 20. The substrates 2 are transferred between the chucks 9 of the substrate holding device 20 and the substrate supporting part 205 which is provided in the processing bath 202.

The substrate supporting part 205 is suspended from the processing bath 202 for free swaying in the directions approximately perpendicular and parallel to the major surfaces of the substrates 2. A pair of engagement recesses 271 is formed in each thick base holding frame 207 of the substrate supporting part 205, one recess near the right end and the other recess near the left end of the frame 207. Bottom edge portions 9e of the pair of the chucks 9 are engageable with the engagement recesses 271.

In other words, relocating means in the fifth preferred embodiment is realized by the suspending members 208, the suspending units 215, the engagement portions 9e and the engagement recesses 271.

The engagement recesses 271 are formed in an upper portion of each base holding frame 207 on the side facing the substrates 2. The engagement recesses 271 each have a U-shaped cross-section which have tapered parts at their openings. The chucks 9 holding the substrates 2 descend in such a manner that each engagement portion 9e keeps in contact with a side wall 271a, which is near the center of the frame 207, and a back wall 271d of each engagement recess 271 (FIG. 18B). After the descent of the chucks 9 is completed, the location of the substrate supporting part 205 is determined as to the directions approximately perpendicular and parallel to the major surfaces of the substrates 2 so that the guide grooves of the chucks 9 and the substrate supporting part 205 are aligned with each other in the two directions above. The substrates 2 are thereafter transferred from the chucks 9 to the substrate supporting part 205 as desired.

To remove the substrates 2 from the processing bath, the chucks 9 descend with their engagement portions 9e each in contact with a side wall 271b, which is near to an edge of the frame 207, and the back wall 271d. After the descent of the chucks 9 is completed, the location of the substrate supporting part 205 is determined as to the two directions mentioned earlier.

The holding poles 10 of the chucks 9 are then slid closer to each other, thereafter they are moved upward by the substrate holding device 20. During the ascent, the processed substrates 2 are transferred to the chucks 9 from the substrate supporting part 205 as if scooped up.

Thus, unlike the preferred embodiments of FIG. 12, 15 and 16, the transfer of the substrates 2 of the fifth preferred embodiment does not require adjustment of the positions of the substrate holding device 20 and the substrate supporting implement through the existence of the substrates 2. Hence, the substrates 2 and the chucks 9 will not be subjected to undesirable stress, thereby ensuring even more accurate and smooth transfer of the substrates 2.

To fulfill both easiness of manufacturing and an excellent anti-corrosiveness, tetrafluorethylene resin, not quartz, is desired as the material for the base holding frames 207. For the supporting and aiding rods 107, 108 and 109, on the other hand, materials such as quartz, silicon carbide, polyetereterketone (PEEK) and tetrafluorethylene resin are suitable.

Similar to the second preferred embodiment, the fifth preferred embodiment does not prohibit the correction of only one of the misregistrations in the directions approximately perpendicular and parallel to the major surfaces of the standing-on-end substrates 2.

Figure 19:
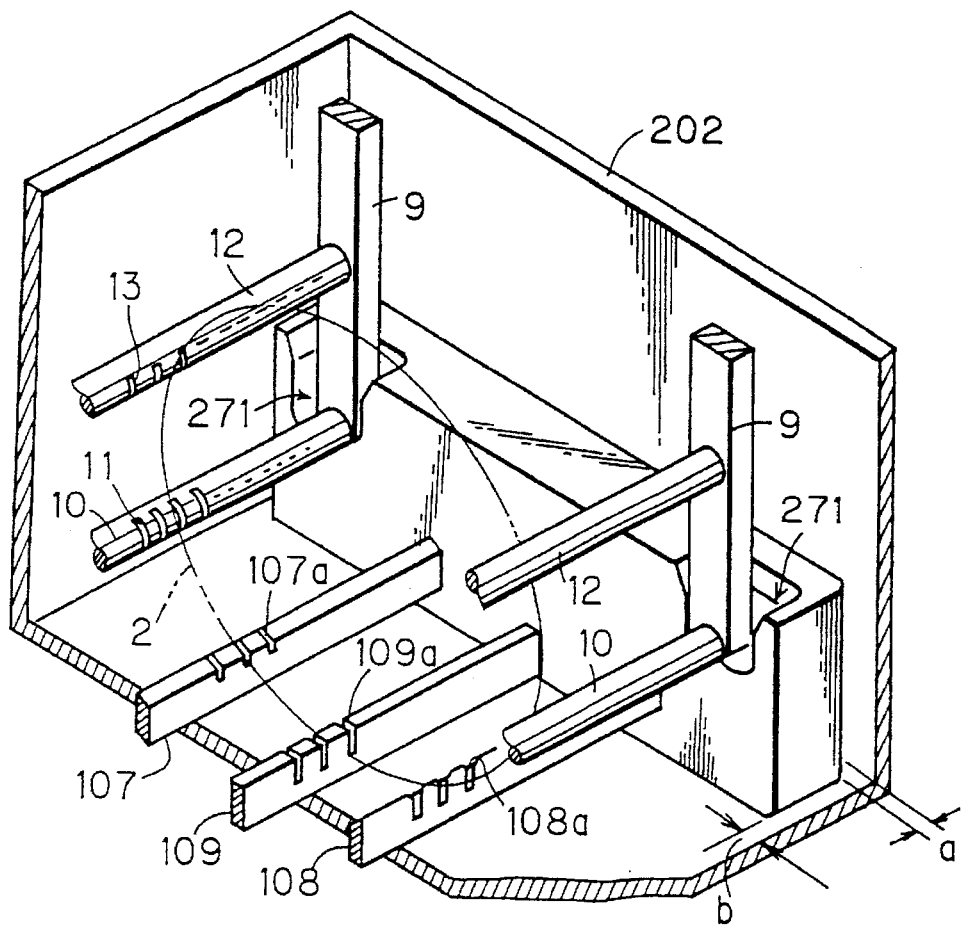
FIG. 19 is a side view of a sixth preferred embodiment of a substrate supporting implement.
Figure 20:
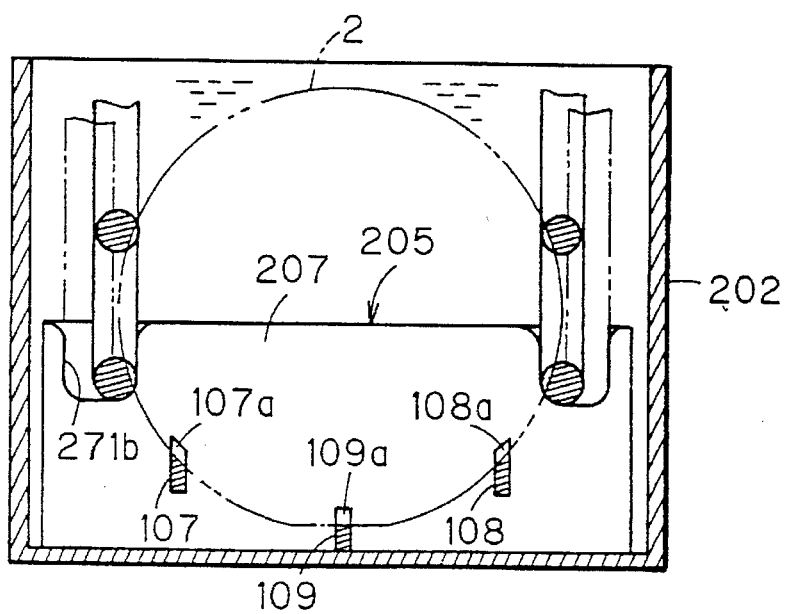
FIG. 20 is a vertical front view of the substrate supporting implement of FIG. 19.

FIGS. 19 and 20 are a perspective view and a vertical front view, respectively, of a substrate supporting implement according to a sixth preferred embodiment of the present invention. The sixth preferred embodiment omits the relocating means which includes the suspending members 208 and the suspending units 215. Instead, the substrate supporting part 205 is set with the bottom of the processing bath 202 for limited lateral slide movement in the directions approximately perpendicular and parallel to the major surfaces of the standing-on-end substrates 2. The substrate supporting implement of the sixth preferred embodiment is otherwise the same as that illustrated in FIGS. 17 and 18.

That is, the base holding frames 207 of the substrate supporting part 205 are each set to the bottom of the processing bath 202 with spacings a and b, which define alignment ranges L in the directions approximately perpendicular and parallel to the major surfaces of the standing-on-end substrates 2, so that the base holding frames 207 are slidable in these directions.

In the substrate supporting implement of the sixth preferred embodiment, as the chucks 9 descend, the engagement portions 9e of the chucks 9 come into engagement with the engagement recesses 271 of the base holding frames 207, thereby bringing the substrate supporting part 205 into a desired position. Hence, the substrates 2 slide into the guide grooves of the substrate supporting part 205 in the desired manner.

Figure 21:
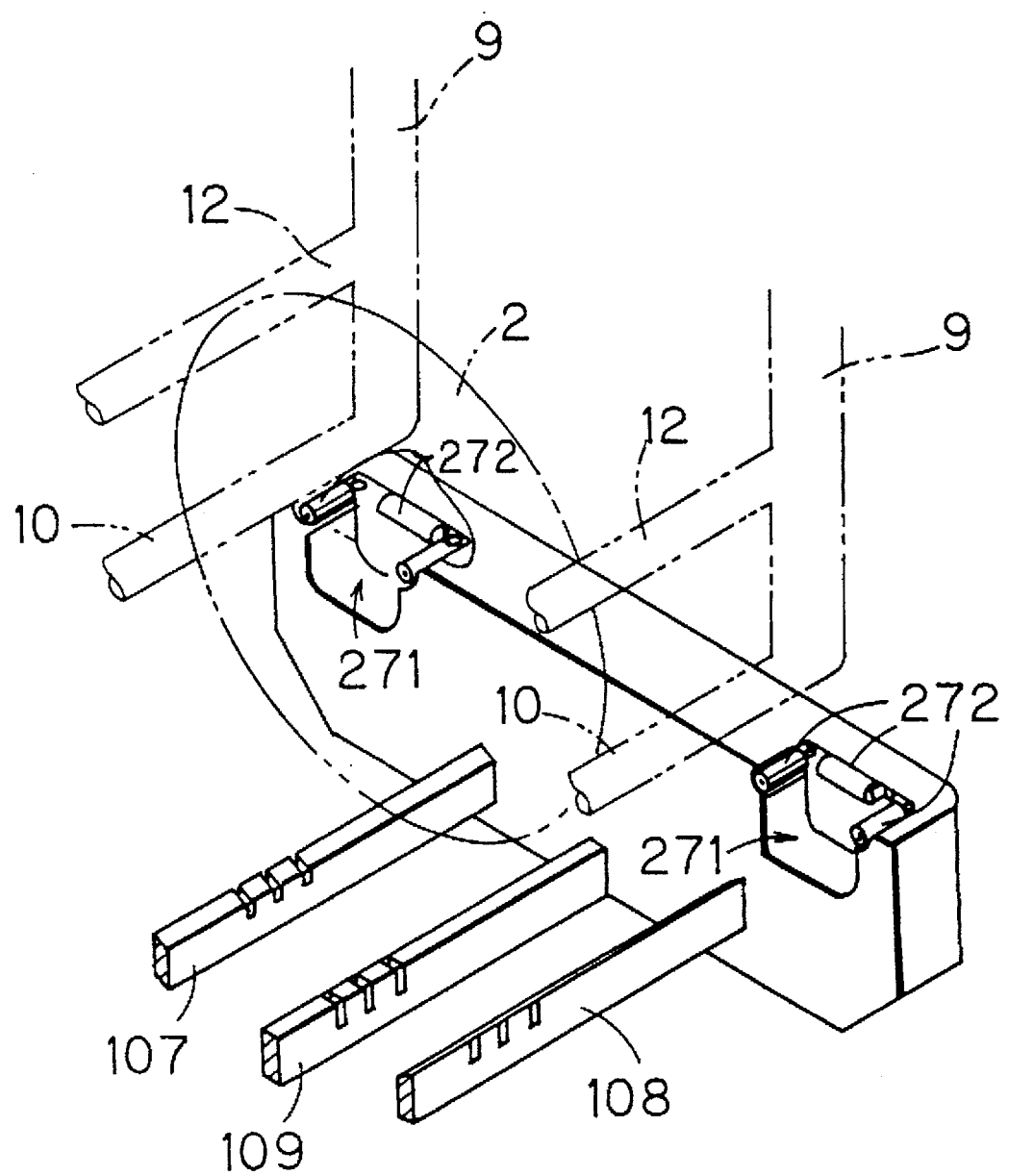
FIG. 21 is a perspective view of a seventh preferred embodiment of a substrate supporting implement.

FIG. 21 is a perspective view of a substrate supporting implement according to a seventh preferred embodiment of the present invention.

The seventh preferred embodiment requires that guide rollers 272 are attached to the opening of each engagement recess 271. The substrate supporting part 205 is disposed on the bottom of the processing bath 202 for limited lateral slide movement. The substrate supporting implement of the seventh preferred embodiment is otherwise the same as illustrated in FIG. 19.

Figure 22:
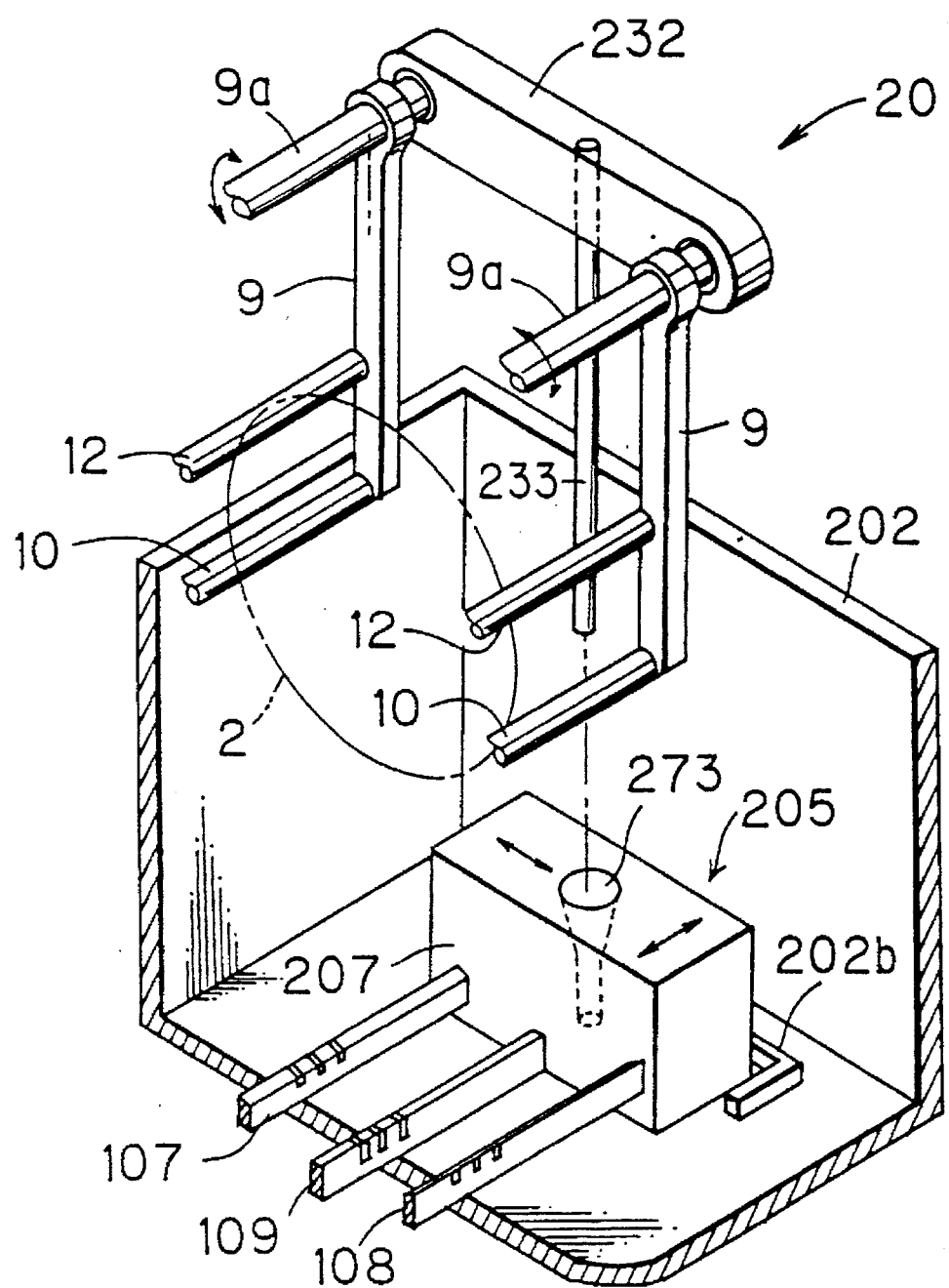
FIG. 22 is a perspective view of an eighth preferred embodiment of a substrate supporting implement.

FIG. 22 is a perspective view of a substrate supporting implement according to an eighth preferred embodiment of the present invention.

In the eighth preferred embodiment, ridges 202b are formed on the bottom of the processing bath 202 to restrict the sliding movement of the substrate supporting part 205. The substrate supporting part 205 is disposed for sliding movement in the directions approximately perpendicular and parallel to the major surfaces of the standing-on-end substrates 2. The substrate holding device 20 comprises lateral base frame members or bridges 232. From a center portion of each lateral base frames 232, an engagement rod 233 is hung down. Each engagement rod 233 is engageable with an engagement hole 273 which is formed in each base holding frame 207 of substrates supporting part 205. Thus, the engagement rods 233, the engagement holes 273 and the ridges 202b form the relocating means.

Due to the ridges 202b, the substrate supporting part 205 makes limited slide movement in the directions approximately perpendicular and parallel to the major surfaces of the standing-on-end substrates 2. By inserting the engagement rods 233 into the engagement holes 273, the guide grooves of the substrate holding device 20 are aligned over the guide grooves of the substrate supporting implement, promising smooth transfer of the substrates 2.

Figure 23A:
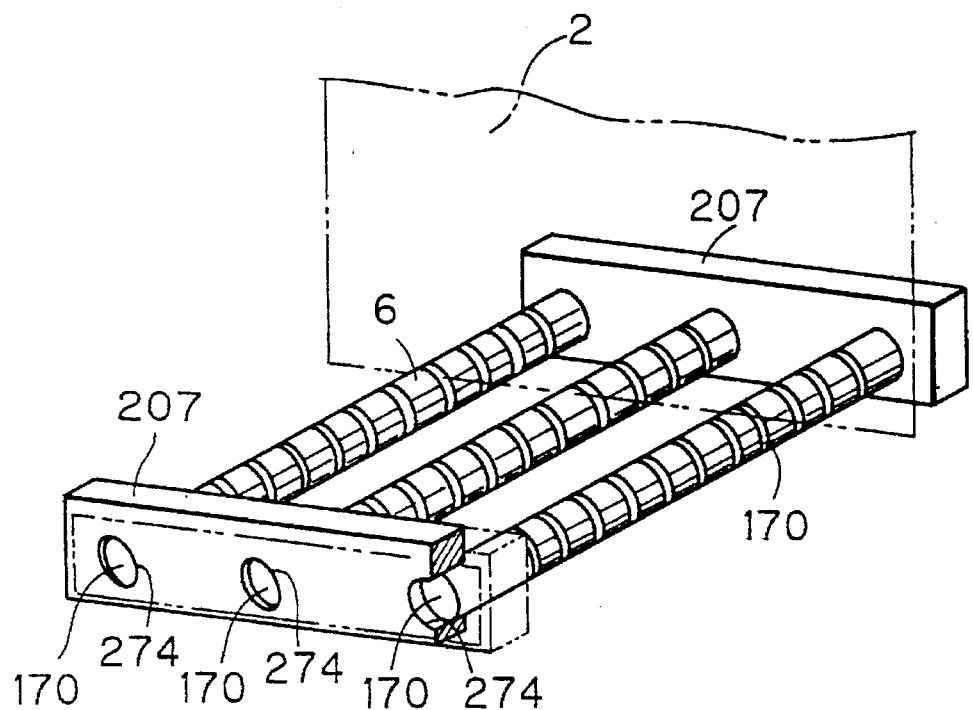
FIG. 23A is a perspective view of the substrate supporting implement of FIG. 22.
Figure 23B:
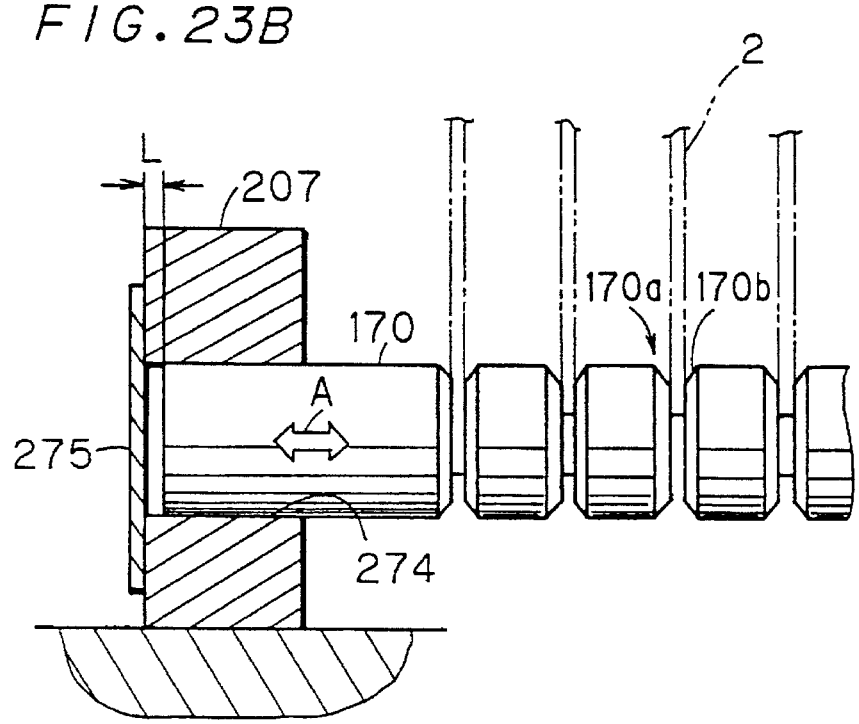
FIG. 23B is a partially enlarged vertical crosssectional view of FIG. 23A.
Figure 24:
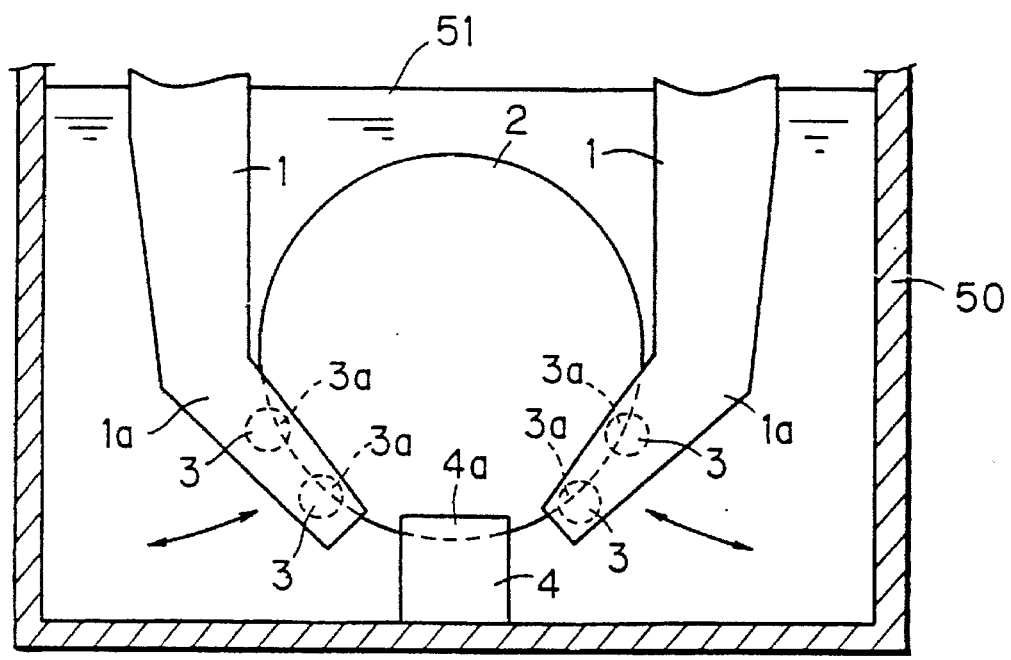
FIG. 24 shows a structure of a first example of a conventional substrate holding device.
Figure 25:
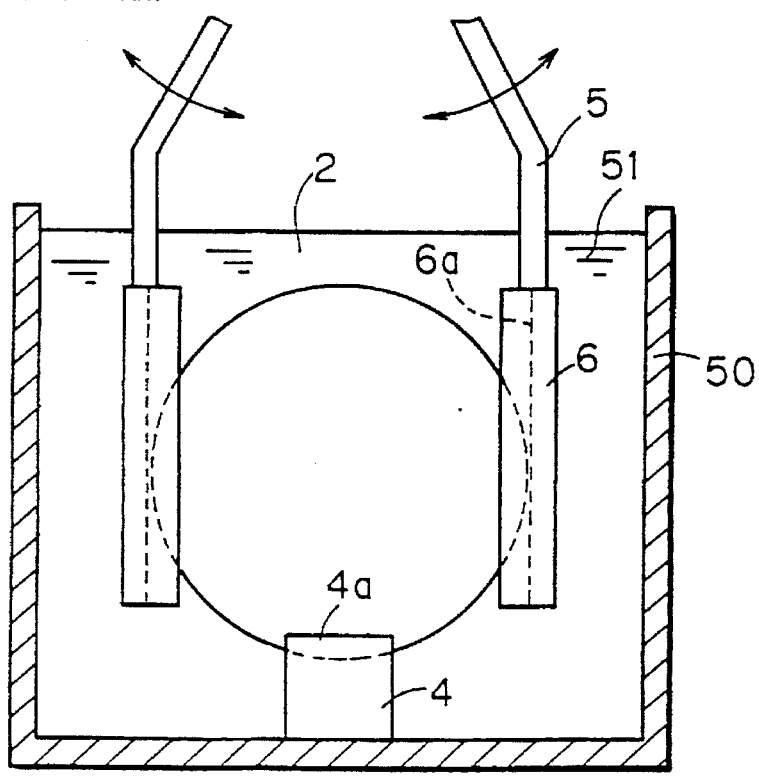
FIG. 25 shows a structure of a second example of a conventional substrate holding device.

FIGS. 23A and 23B are a perspective view and a partial enlarged cross-section of a substrate supporting implement according to a ninth preferred embodiment of the present invention, respectively.

The substrate supporting implement of the ninth preferred embodiment processes square substrates 2. For this purpose, the base holding frames 207 are fixed in the processing bath 202 and provided with three holding poles 170 and loose engagement holes 274. The holding poles 170 are loosely engageable with their pertaining engagement holes 274 so that they are independently slidable.

Assume that the substrates 2 which have been transferred by the substrate holding device 20 are misaligned over guide grooves 170a of the holding poles 170 in the direction indicated by the arrow A within a fixed range L. The descending substrates 2 come into contact at their bottom rims with tapered parts 170b of the guide grooves 170a. Guided along the tapering parts 170b, the substrates 2 slide into the guide grooves 170a and stand on end in the guide grooves 170a. As the substrates 2 slide into the guide grooves 170a, the holding poles 170 slide in the direction of the arrow A, thereby aligning the substrates 2 over the guide grooves 170a in the direction of arrow A.

In short, when transferring the substrates 2 from the chucks 9 to the holding poles 170, the substrate supporting implement of the ninth preferred embodiment corrects any misalignment between the guide grooves of the holding poles 10 and the guide grooves 170a of the holding poles 170 in the direction of arrow A. The substrate supporting element also corrects any misalignment between the guide grooves 170a of the different holding poles 170, at the same time through the existence of the substrates 2.

Therefore the relocating means of the ninth preferred embodiment is formed by loose engagement holes 274 and their associated stoppers 275. The stoppers 275 are attached externally to the base holding frame 207. What is aimed at by providing the stoppers 275 is to prevent the ends of the holding poles 170 from projecting outside through the loose engagement holes 274, thereby limiting the sliding movement of the holding poles 170 within the fixed range L.

While the invention has been shown and described in detail, the foregoing description is in all aspects illustrative and not restrictive. It is understood that numerous modifications and variations can be devised without departing from the scope of the invention.

We claim:

1. An apparatus for dipping substrates in a processing fluid, said apparatus comprising:

(A) a processing bath for holding said processing fluid;

(B) a supporting implement provided in said processing bath for supporting said substrates;

(C) a substrate holding device disposed above said processing bath for moving said substrates into and out of said processing bath, said substrate holding device including (1) a chuck for engaging said substrates, said chuck comprising:

(a) first and second chucking frames spaced apart to form a gap therebetween, said first chucking frame having a first pair of vertical frame rods, said second chucking frame having a second pair of vertical frame rods;

(b) first and second holding members attached to respective portions of said first and second chucking frames and held in a substantially horizontal direction, said first holding member having a first side surface and said second holding member having a second side surface, said first and second side surfaces facing each other, a first periodical linear array of first grooves disposed on said first surface and a second periodical linear array of first grooves disposed on said second surface;

(c) at least one guide member coupled to at least one of said first and second chucking frames and held in said substantially horizontal direction, said at least one guide member having at least one surface, a periodical linear array of second grooves disposed on said at least one surface of said at least one guide member, said first and second periodical arrays of first grooves and said periodical linear array of said second grooves being aligned with each other;

(2) a chuck driver coupled to said first and second chucking frames for opening and closing said first and second chucking frames; and (D) a transporter coupled to said substrate holding device for raising and lowering said substrate holding device to move said substrates into and out of said processing fluid and said processing bath.

2. The apparatus of claim 1, wherein each of said first grooves of said first periodical linear array has: a bottom, a first straight groove portion provided on said bottom, and a first opened lip portion provided on said first straight groove portion which tapers downward towards said bottom.

3. The apparatus of claim 2, wherein said bottom of each of said first grooves has a convex surface.

4. The apparatus of claim 1, wherein each of said second grooves of said second linear array has: a bottom, a second straight groove portion provided on said bottom, and a second opened lip portion provided on said second straight groove portion which tapers downward towards said bottom.

5. The apparatus of claim 4, wherein said at least one guide member comprises:

first and second pole members each having said periodical linear array of second grooves and disposed substantially in said horizontal direction.

6. The apparatus of claim 4, wherein each of said at least one guide members comprises:

a pole member having said periodical linear array of second grooves and disposed substantially in said horizontal direction; and arms having first portions coupled to said first and second chucking frames through horizontal pivots, and second portions connected to the respective end portions of said pole member.

7. An apparatus for dipping substrates in a processing fluid, said apparatus comprising:

(A) a processing bath for holding said processing fluid;

(B) a supporting implement provided in said processing bath for said substrates;

(C) a substrate holding device disposed above said processing bath for moving said substrate into and out of said processing bath, said substrate holding device including:

(1) a chuck for engaging said substrates, said chuck comprising:

(a) first and second chucking frames spaced apart to form a gap therebetween;

(b) first and second holding members attached to respective portions of said first and second chucking frames and held in a substantially horizontal direction, said first holding member having a first side surface and said second holding member having a second side surface, said first and second side surfaces facing each other, a first periodical linear array of first grooves disposed on said first surface and a second periodical linear array of first grooves disposed on said second surface, said first and second periodical arrays of first grooves having an array period;

(c) at least one guide member coupled to at least one of said first and second chucking frames and held in said substantially horizontal direction, said at least one guide member having at least one surface, a periodical linear array of second grooves disposed on said at least one surface of said at least one guide member, said first and second periodical arrays of first grooves and said first periodical linear arrays of second grooves being aligned with each other;

(2) a chuck driver coupled to said first and second chucking frames for opening and closing said first and second chucking frames;

(D) a transporter coupled to said substrate holding device for raising and lowering said substrate holding device to move said substrates into and out of said processing bath; and (E) said supporting implement including:

(1) parallel first and second supporting rods disposed below said first and second periodical linear arrays of said first grooves and each having a periodical linear array of third grooves having an array period equal to the array period of said first and second periodical linear arrays of said first grooves;

(2) an aiding rod disposed between and in parallel with said first and second supporting rods, said aiding rod having a periodical linear array of fourth grooves which has an array period equal to the array period of said first and second periodical linear arrays of said first grooves; and (3) a rod-holder for holding said first and second supporting rods and said aiding rod approximately horizontal at respective predetermined positions within said processing bath.

8. The apparatus of claim 7, wherein each of said substrates is a disk having an orientation flat defined by a linear edge; and said aiding rod is held by said rod-holder so that an opening edge of each of said fourth grooves is at a level higher than a level of said linear edge of said orientation flat and a bottom surface of each of said fourth grooves is at a level lower than level of said linear edge of said orientation flat when said substrates are supported by said first and second supporting rods with each orientation flat facing downward.

9. The apparatus of claim 8, wherein each of said fourth grooves include a fourth straight groove portion provided on a bottom of each of said fourth grooves; and a fourth opened lip portion provided on said fourth straight groove portion tapering downward toward said bottom of each of said fourth grooves.

10. The apparatus of claim 9, wherein said first and second supporting rods and said aiding rod are disposed in parallel with each other along an elongated direction; and said supporting implement also including:

relocating means for relocating said first and second supporting rods and said aiding rod in said elongated direction.

11. The apparatus of claim 10, wherein said rod-holder comprises:

a holding base frame for horizontally holding said first and second supporting rods and said aiding rod;

a suspension for suspending said holding base frame from a brim of said processing bath; and a hanger mounted to a top portion of said suspension, for suspending said suspension from said processing bath, said hanger comprising:

a swing-support shaft attached to said top portion of said suspension so as to be parallel with said first and second supporting rods;

a base disposed on said brim of said processing bath; and a bearing means mounted to said base, for rotatably supporting said swing-support shaft; whereby said suspension is capable of swinging in a plane parallel to respective major surfaces of said substrates supported by said first and second supporting rods.

12. The apparatus of claim 11, wherein said suspension comprises:

a first suspending member hanging from said swing-support shaft; and a second suspending member provided between said first suspending member and said holding base frame; and said relocating means comprises:

a first hinge inserted between said second suspending member and said holding base frame means; and a second hinge inserted between said first and second suspending members.

13. The apparatus of claim 11, wherein said relocating means includes:

roller means attached to said bearing means and rotatable on said base in a direction parallel to the axis of said first and second supporting rods.

14. The apparatus of claim 11, wherein said bearing means comprises a half-cut thrust bearing formed by omitting an upper half portion of a regular bearing and slidable on said base in a direction parallel to the axis of said swing-support, wherein said half-cut thrust bearing also serves as said relocating means.

15. The apparatus of claim 14, wherein said rod-holder comprises:

a first portion supporting said first and second supporting rods and said aiding rod; and a second portion provided on said first portion and having first and second recesses each having an opening tapering downward towards said bottom portion, whereby said recesses serve as said relocating means by receiving respective bottom ends of said first and second chucking frames therein.

16. The apparatus of claim 10, wherein said rod-holder comprises:

a first portion supporting said first and second supporting-rods and said aiding rod, and slidably placed on a bottom of said processing bath; and a second portion provided on said first portion and including first and second recesses each having an opening tapering downward towards said bottom portion, whereby said recesses serve as said relocating means by receiving respective bottom ends of said first and second chucking frames therein.

17. The apparatus of claim 10, wherein said substrate holding device further comprises a bridge member provided across said first and second chucking frames; and a vertical rod fixed to and hanging from said bridge member; and said rod-holder comprises:

a first portion supporting said first and second supporting rods and said aiding rod, and slidably placed on a bottom of said processing bath; and a second portion provided on said first portion including a recess having an opening tapering downward towards said bottom-portion, whereby a combination of said vertical rod and said recess serves as said relocating means by receiving the bottom end of said vertical rod in said recess.

18. The apparatus of claim 17, wherein said processing bath comprises:

a bottom surface; and ridges formed on said bottom surface, said ridges restricting horizontal movement of said rod-holder.

19. An apparatus for dipping substrates in a processing fluid, said apparatus comprising:

(A) a processing bath for holding said processing fluid;

(B) a supporting implement provided in said processing bath for said substrates;

(C) a substrate holding device disposed above said processing bath for moving said substrate into and out of said processing bath, said substrate holding device including:

(1) a chuck for engaging said substrates, said chuck comprising:

(a) first and second chucking frames spaced apart to form a gap therebetween;

(b) first and second holding members attached to respective portions of said first and second chucking frames and held in a substantially horizontal direction, said first holding member having a first side surface and said second holding member having a second side surface, said first and second side surfaces facing each other, a first periodical linear array of first grooves disposed on said first surface and a second periodical linear array of first grooves disposed on said second surface;

(c) at least one guide member coupled to at least one of said first and second chucking frames and held in said substantially horizontal direction, said at least one guide member having at least one surface, a periodical linear array of second grooves disposed on said at least one surface of said at least one guide member, said first and second periodical arrays of first grooves and said first periodical linear arrays of second grooves being aligned with each other;

(2) a chuck driver coupled to said first and second chucking frames for opening and closing said first and second chucking frames;

(D) a transporter coupled to said substrate holding device for raising and lowering said substrate holding device to move said substrates into and out of said processing bath; and (E) said supporting implement comprising:

(1) a plurality of supporting rods each having a periodical linear array of third grooves, wherein an array period of said periodical linear array of third grooves is substantially equal to an array period of said first and second periodical linear arrays of first grooves; and (2) first and second holding members connected to respective ends of said plurality of said supporting rods, for horizontally holding said plurality of supporting rods in parallel so that said plurality of said supporting rods are moveable in a direction parallel to respective elongated directions of said plurality of supporting rods.

20. An apparatus for dipping substrates in a processing fluid, said apparatus comprising:

(A) a processing bath for holding said processing fluid;

(B) a supporting implement provided in said processing bath for supporting said substrates;

(C) a substrate holding device disposed above said processing bath for moving said substrates into and out of said processing bath, said substrate holding device including (1) a chuck for engaging said substrates, said chuck comprising:
  (a) first and second chucking frames spaced apart to form a gap therebetween, said first chucking frame having a first pair of vertical frame rods said second chucking frame having a second pair of vertical frame rods;
  (b) first and second holding members attached to respective portions of said first and second chucking frames and held in a substantially horizontal direction, said first holding member having a first side surface and said second holding member having a second side surface, said first and second side surfaces facing each other, a first periodical linear array of first grooves disposed on said first surface and a second periodical linear array of first grooves disposed on said second surface; and
  (c) at least one guide member, said at least one guide member having at least one surface, a periodical linear array of second grooves disposed on said at least one surface of said at least one guide member, said first and second periodical arrays of first grooves and said periodical linear array of said second grooves being aligned with each other;
(2) a chuck driver coupled to' said first and second chucking frames for opening and closing said first and second chucking frames; and
(D) a transporter coupled to said substrate holding device for raising and lowering said substrate holding device to move said substrates into and out of said processing fluid and said processing bath.

21. An apparatus for dipping substrates into a processing fluid, said apparatus comprising:
  a processing bath for holding said processing fluid;
  a supporting implement provided in said processing bath for supporting said substrates;
  a substrate holding device disposed above said processing bath for holding said substrates, said substrate holding device including first and second chucking frames, first and second holding members attached to said first and second chucking frames, and at least one guide coupled to at least one of said first and second chucking frames, said first chucking frame including a first pair of vertical frame rods, said second chucking frame including a second pair of vertical frame rods;
  a plurality of grooves disposed on said at least one guide and said first and second holding members, said plurality of grooves being aligned with each other so that respective top-side and bottom-side rims of said substrates can be received in said grooves;
  a chuck driver coupled to said first and second chucking frames for opening and closing said first and second chucking frames; and
  a transporter coupled to said substrate holding device for raising and lowering said supporting implement to move said substrates in and out of said processing fluid in said processing bath.

\* \* \* \* \*